(12) United States Patent
Kim et al.

(10) Patent No.: US 11,907,454 B2
(45) Date of Patent: Feb. 20, 2024

(54) TOUCH DISPLAY DEVICE

(71) Applicant: LG Display Co., Ltd., Seoul (KR)

(72) Inventors: TaeHwan Kim, Gyeonggi-do (KR); DongHee Yoo, Gyeonggi-do (KR); JungSun Beak, Gyeonggi-do (KR); SunMi Lee, Gyeonggi-do (KR); HyeonChul Im, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/884,534

(22) Filed: Aug. 9, 2022

(65) Prior Publication Data

US 2022/0382402 A1     Dec. 1, 2022

Related U.S. Application Data

(63) Continuation of application No. 17/553,258, filed on Dec. 16, 2021, which is a continuation of application
(Continued)

(30) Foreign Application Priority Data

Nov. 5, 2019  (KR) .................. 10-2019-0140497

(51) Int. Cl.
*G06F 3/041*  (2006.01)
*G06F 3/044*  (2006.01)
(Continued)

(52) U.S. Cl.
CPC .......... *G06F 3/0412* (2013.01); *G06F 3/0443* (2019.05); *G06F 3/04164* (2019.05);
(Continued)

(58) Field of Classification Search
CPC .. G06F 3/0412; G06F 3/04164; G06F 3/0443; G06F 3/0446; G06F 2203/04102;
(Continued)

(56) References Cited

U.S. PATENT DOCUMENTS 10,068,952 B2   9/2018  Teramoto et al.
10,505,145 B2  12/2019  Lee et al.
(Continued)

FOREIGN PATENT DOCUMENTS

JP    2012-113934 A    6/2012

*Primary Examiner* — Adam R. Giesy
(74) *Attorney, Agent, or Firm* — Morgan, Lewis & Bockius LLP

(57) ABSTRACT

Embodiments of the disclosure relate to a touch display device with enhanced light extraction efficiency, comprising an insulation film including a concave portion and a surrounding portion disposed around the concave portion, a first electrode disposed on the concave portion and a portion of the surrounding portion, a bank including a first portion disposed on the first electrode in an area corresponding to a portion of the concave portion and a second portion disposed on the insulation film and the first electrode in an area corresponding to the surrounding portion, an organic layer disposed on the first electrode exposed by the bank, the organic layer including a light emitting layer, a second electrode disposed on the organic layer and the bank, an encapsulation layer disposed on the second electrode, a touch buffer layer disposed on the encapsulation layer, a plurality of touch electrodes disposed on the touch buffer layer, and at least one light reflecting member disposed on the touch buffer layer and spaced apart from the plurality of touch electrodes.

24 Claims, 17 Drawing Sheets

Related U.S. Application Data

No. 17/080,090, filed on Oct. 26, 2020, now Pat. No. 11,237,659.

(51) Int. Cl.
  *H10K 50/844* (2023.01)
  *H10K 50/856* (2023.01)
  *H10K 59/40* (2023.01)
  *H10K 59/122* (2023.01)
  *G09G 3/3233* (2016.01)

(52) U.S. Cl.
  CPC ......... *H10K 50/844* (2023.02); *H10K 50/856* (2023.02); *H10K 59/122* (2023.02); *H10K 59/40* (2023.02); *G06F 3/0446* (2019.05); *G06F 2203/04102* (2013.01); *G06F 2203/04103* (2013.01); *G06F 2203/04111* (2013.01); *G06F 2203/04112* (2013.01); *G09G 3/3233* (2013.01); *G09G 2300/0452* (2013.01); *G09G 2380/02* (2013.01)

(58) Field of Classification Search
  CPC . G06F 2203/04103; G06F 2203/04111; G06F 2203/04112; H01L 27/323; H01L 27/3246; H01L 51/5253; H01L 51/5271; H01L 51/5209; H01L 27/3248; H01L 27/3276; H01L 27/3211; H01L 51/5203; G09G 3/3233; G09G 2300/0452; G09G 2380/02; H10K 50/844; H10K 50/856; H10K 59/122; H10K 59/40; H10K 50/813; H10K 59/123; H10K 59/131; H10K 50/805; H10K 59/35

See application file for complete search history.

(56) References Cited

U.S. PATENT DOCUMENTS

| | | | |
|---|---|---|---|
| 10,854,845 B2 | 12/2020 | Lee et al. | |
| 2016/0246404 A1 | 8/2016 | Zhang et al. | |
| 2017/0125740 A1* | 5/2017 | Lee | H10K 50/856 |
| 2019/0115411 A1* | 4/2019 | Park | G06F 3/0412 |
| 2019/0252470 A1* | 8/2019 | Lee | H10K 59/35 |
| 2020/0194509 A1* | 6/2020 | Beak | H10K 50/856 |
| 2020/0194711 A1* | 6/2020 | Kim | H10K 59/35 |

* cited by examiner

TOUCH DISPLAY DEVICE

CROSS-REFERENCE TO RELATED APPLICATION

This application is a continuation of co-pending U.S. patent application Ser. No. 17/553,258, filed on Dec. 16, 2021, which is a continuation of U.S. patent application Ser. No. 17/080,090, filed on Oct. 26, 2020, now U.S. Pat. No. 11,237,659, which claims priority from Korean Patent Application No. 10-2019-0140497, filed on Nov. 5, 2019. Each of the above prior U.S. and Korean patent applications is hereby incorporated by reference for all purposes as if fully set forth herein.

BACKGROUND

Field

Embodiments of the disclosure relate to touch display devices.

Description of Related Art

The growth of the information society leads to various needs for image display devices. Recently, various display devices are being used, such as liquid crystal displays, plasma display devices, and organic light emitting display devices.

Among others, touch display devices provide an input scheme that allows users easier and more intuitive and convenient entry of information or commands without the need for buttons, a keyboard, a mouse, or other typical input means.

The touch display device should be able to grasp whether the user touches and, if any, precisely sense the coordinates of the touch to provide touch-based entry.

Conventional touch display devices have a touch panel with a number of touch electrodes arrayed thereon in a complicated layout and thus suffer from difficulty in securing a light emitting area for the display device and enhancing brightness due to various factors, such as the structure, position, or layout of the touch electrodes.

BRIEF SUMMARY

Embodiments of the disclosure provide a touch display device with enhanced light extraction efficiency.

Embodiments of the disclosure provide a touch display device with a structure capable of preventing color mixing between two adjacent subpixels.

Embodiments of the disclosure provide a touch display device with a structure simple to process.

According to embodiments of the disclosure, there may be provided a touch display device comprising an insulation film including a concave portion and a surrounding portion disposed around the concave portion, the concave portion including a flat portion and an inclined portion surrounding the flat portion, a first electrode disposed on the concave portion and a portion of the surrounding portion, a bank including a first portion disposed on the first electrode in an area corresponding to a portion of the concave portion and a second portion disposed on the insulation film and the first electrode in an area corresponding to the surrounding portion, an organic layer disposed on the first electrode exposed by the bank, the organic layer including a light emitting layer, a second electrode disposed on the organic layer and the bank, an encapsulation layer disposed on the second electrode, a touch buffer layer disposed on the encapsulation layer, a plurality of touch electrodes disposed on the touch buffer layer, and a light reflecting member disposed on the touch buffer layer and spaced apart from the plurality of touch electrodes.

According to embodiments of the disclosure, there may be provided a touch display device with light extraction efficiency enhanced through at least one concave portion formed in an insulation film and a light reflecting member provided in a non-display area.

According to embodiments of the disclosure, there may be provided a touch display device with a structure capable of preventing color mixing between adjacent pixels by applying a light reflecting member.

According to embodiments of the disclosure, there may be provided a touch display device with a structure simple to process by allowing the light reflecting member and the touch electrode to be formed in the same process.

DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
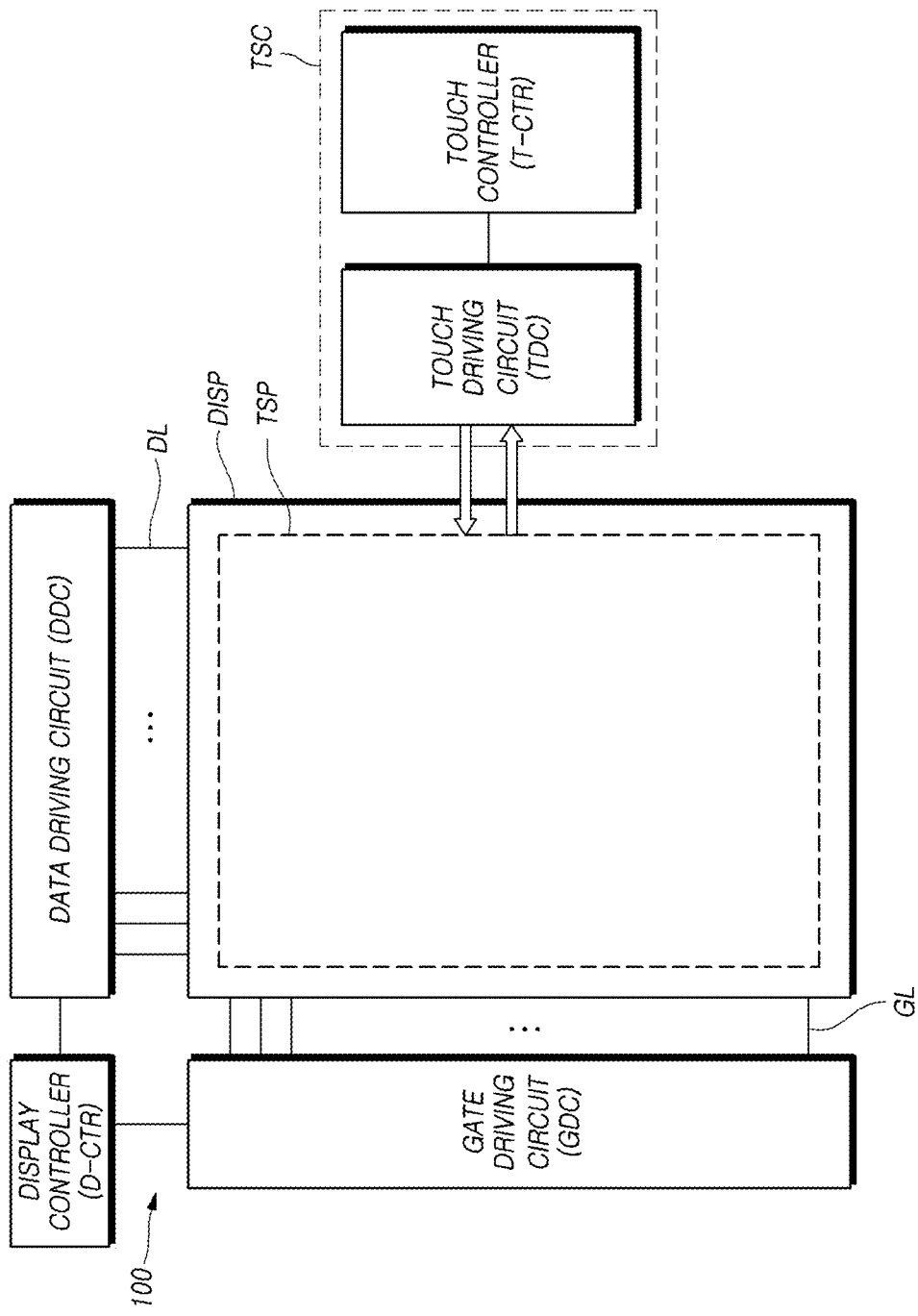
FIG. 1 is a view illustrating a system configuration of a touch display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, embodiments of the disclosure are described in detail with reference to the accompanying drawings.

FIG. 1 is a view illustrating a system configuration of a touch display device according to embodiments of the disclosure.

Referring to FIG. 1, a touch display device according to embodiments of the disclosure may provide an image display function to display images and a touch sensing function to sense the user's touch.

The touch display device according to embodiments of the disclosure may include a display panel DISP on which data lines and gate lines are disposed to display images and a display driving circuit to drive the display panel DISP.

The display driving circuit may include, e.g., a data driving circuit DDC to drive the data lines, a gate driving circuit GDC to drive the gate lines, and a display controller D-CTR to control the data driving circuit DDC and the gate driving circuit GDC.

The touch display device according to embodiments of the disclosure may include a touch panel TSP on which a plurality of touch electrodes 320, as touch sensors, are disposed, and a touch sensing circuit TSC to perform driving and sensing processing of the touch panel TSP.

The touch sensing circuit TSC supplies a driving signal to the touch panel TSP to drive the touch panel TSP, detects a sensing signal from the touch panel TSP, and senses the presence or absence of a touch and/or the position (e.g., coordinates) of a touch based on the sensing signal.

The touch sensing circuit TSC may include, e.g., a touch driving circuit TDC to supply driving signals and receive sensing signals and a touch controller T-CTR to calculate the presence or absence of a touch and/or the position (e.g., coordinates) of a touch.

The touch sensing circuit TSC may be implemented as one or two or more components (e.g., integrated circuits) and may be implemented separately from the display driving circuit.

The whole or part of the touch sensing circuit TSC may be integrated with the display driving circuit or one or more of the internal circuits of the display driving circuit. For example, the touch driving circuit TDC of the touch sensing circuit TSC, along with the data driving circuit DDC of the display driving circuit, may be implemented as an integrated circuit.

The touch display device according to embodiments of the disclosure may sense a touch based on the capacitance created at the touch electrodes TE (touch sensors).

The touch display device according to embodiments of the disclosure may sense a touch in a mutual capacitance-based touch sensing scheme or self capacitance-based touch sensing scheme, as the capacitance-based touch sensing scheme.

Figure 2:
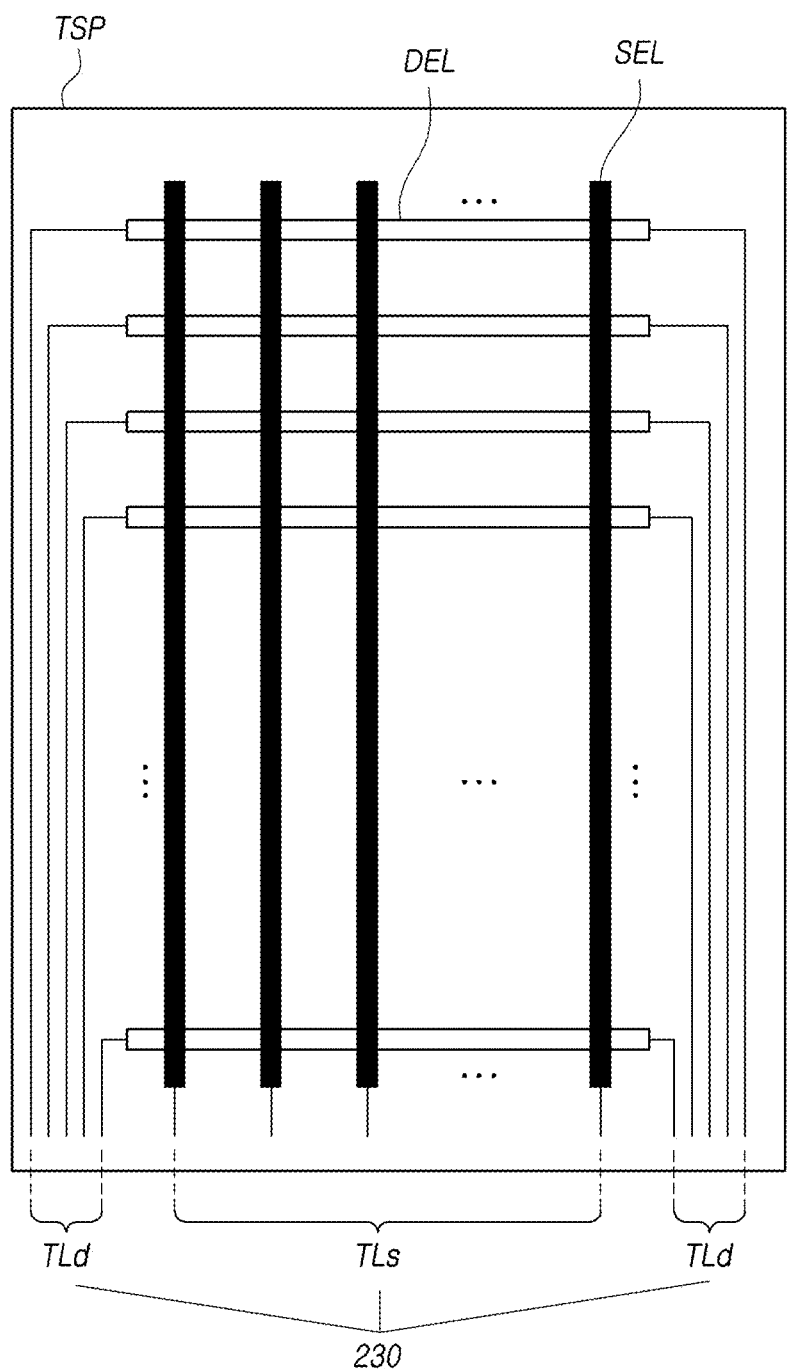
FIGS. 2 and 3 are views illustrating an example touch panel TSP when a touch display device senses a touch in a mutual capacitance-based touch sensing scheme according to embodiments of the disclosure.
Figure 3:
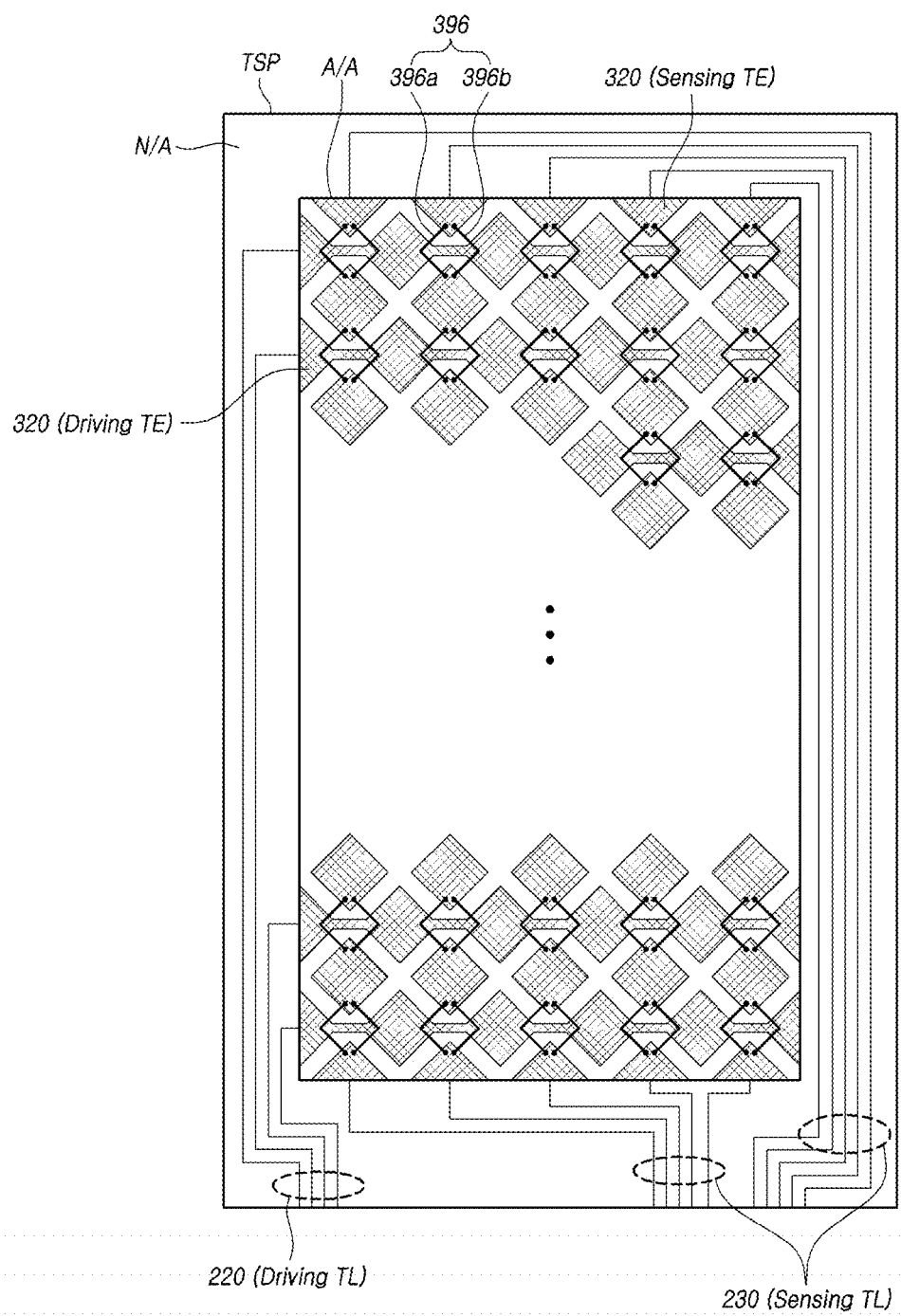
Figure 4:
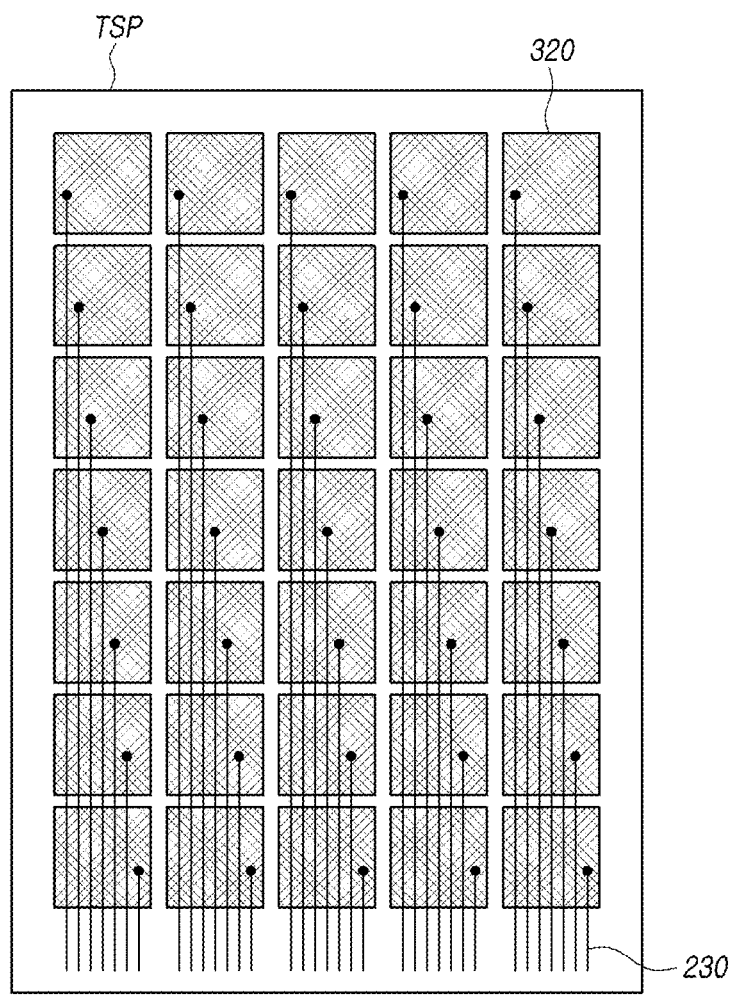
FIG. 4 is a view illustrating an example touch panel TSP when a touch display device senses a touch in a self capacitance-based touch sensing scheme according to embodiments of the disclosure.

FIGS. 2 to 4 are views illustrating three examples of the touch panel TSP in the touch display device according to embodiments of the disclosure. FIGS. 2 and 3 illustrate an example touch panel TSP when the touch display device according to embodiments of the disclosure senses a touch in a mutual capacitance-based touch sensing scheme, and FIG. 4 illustrates an example touch panel TSP when the touch display device according to embodiments of the disclosure senses a touch in a self capacitance-based touch sensing scheme.

Referring to FIG. 2, in the mutual capacitance-based touch sensing scheme, the plurality of touch electrodes disposed on the touch panel TSP may be divided into driving touch electrodes (also referred to as driving electrodes, transmission electrodes, or driving lines) to which driving signals are applied and sensing touch electrodes (also referred to as sensing electrodes, reception electrodes, or sensing lines) to receive sensing signals and to, along with the driving touch electrodes, create capacitance.

Among the driving touch electrodes of the touch electrodes, driving touch electrodes disposed along the same row (or the same column) may be electrically connected with each other in an integration scheme (or a bridge pattern-based connection scheme) to form a single driving touch electrode line DEL.

Referring to FIG. 2, among the sensing touch electrodes of the touch electrodes, sensing touch electrodes disposed along the same column (or the same row) may be electrically connected with each other in a bridge pattern (or by an integration scheme) to form a single sensing touch electrode line SEL.

In the mutual capacitance-based touch sensing scheme, the touch sensing circuit TSC applies driving signals to one or more driving touch electrode lines DEL, receives sensing signals from one or more sensing touch electrode lines SEL, and detects, e.g., the presence or absence of a touch and/or the coordinates of a touch based on a variation in capacitance (mutual capacitance) between the driving touch electrode line DEL and the sensing touch electrode line SEL depending on the presence or absence of a pointer, e.g., a finger or pen, based on the received sensing signal.

Referring to FIG. 2, a plurality of driving touch electrode lines DEL and a plurality of sensing touch electrode lines SEL each are electrically connected with the touch driving circuit TDC through one or more touch lines 230 to transfer driving signals and sensing signals.

Specifically, to transfer driving signals, the plurality of driving touch electrode lines DEL each may be electrically connected with the touch driving circuit TDC through one or more driving touch lines TLd. To transfer sensing signals, the plurality of sensing touch electrode lines SEL each may be electrically connected with the touch driving circuit TDC through one or more sensing touch lines TLs.

The touch display device 100 in the mutual capacitance-based touch sensing scheme may be represented as shown in FIG. 3.

Referring to FIG. 3, a plurality of touch electrodes 320 are disposed on the touch panel TSP, and touch lines 220 and 230 to electrically connect the touch electrodes 320 with the touch driving circuit TDC may be disposed on the touch panel TSP.

Touch pads contacted by the touch driving circuit TDC to electrically connect the touch lines 220 and 230 with the touch driving circuit TDC may be present on the touch panel TSP.

The touch electrodes 320 and the touch lines 220 and 230 may be present on the same layer or on different layers.

Two or more touch electrodes forming one driving touch electrode line are denoted driving touch electrodes Driving TE. Two or more touch electrodes 320 forming one sensing touch electrode line are denoted sensing touch electrodes Sensing TE.

At least one touch line 220 may be connected per driving touch electrode line, and at least one touch line 230 may be connected per sensing touch electrode line.

At least one touch line 220 connected per driving touch electrode line is denoted a driving touch line Driving TL. At least one touch line 230 connected per sensing touch electrode line is denoted a sensing touch line Sensing TL.

One touch pad may be connected per touch line 220 or 230.

Referring to FIG. 3, each of the plurality of touch electrodes 320 may be shaped as a diamond in its contour and, according to cases, each touch electrode 320 have a rectangular (including a square) shape or other various shapes.

A bridge component for connecting two touch electrodes 320 may include one or two or more bridge patterns 396.

For example, when the bridge patterns 396 include two bridge patterns 396a and 396b, the bridge patterns 396 may include a first bridge pattern 396a and a second bridge pattern 396b.

The first and second bridge patterns 396a and 396b may have a bent shape, but embodiments of the disclosure are not limited thereto. For example, the first and second bridge patterns 396a and 396b may be shaped as a bar, but this is merely an example and the bridge patterns may be formed in other various shapes.

The bent first bridge pattern 396a may have a first end electrically connected with one touch electrode and a second end electrically connected with another touch electrode.

According to an embodiment, the touch panel TSP may be present inside a display panel with an active area A/A and a non-active area N/A (embedded type).

When the touch panel TSP is of the embedded type, the touch panel TSP and the display panel may be formed in one panel manufacturing process.

When the touch panel TSP is of the embedded type, the touch panel TSP may be regarded as an assembly of multiple touch electrodes 320. Here, the plate on which the multiple touch electrodes 320 are placed may be a dedicated substrate or a layer (e.g., an encapsulation layer) preexisting in the display panel.

Referring to FIG. 4, in the self capacitance-based touch sensing scheme, each touch electrode 320 disposed on the touch panel TSP plays a role both as a driving touch electrode (to be applied with driving signal) and as a sensing touch electrode (to receive sensing signal).

In other words, a driving signal is applied to each touch electrode 320, and a sensing signal is received through the driving signal-applied touch electrode 320. Thus, the self capacitance-based touch sensing scheme does not differentiate between driving electrodes and sensing electrodes.

In the self capacitance-based touch sensing scheme, the touch sensing circuit TSC applies driving signals to one or more touch electrodes 320, receives sensing signals from the driving signal-applied touch electrode 320, and detects, e.g., the presence or absence of a touch and/or the coordinates of a touch based on a variation in capacitance between the touch electrode 320 and a point, e.g., a finger or pen, based on the received sensing signal.

Referring to FIG. 4, each of the plurality of touch electrodes 320 is electrically connected with the touch driving circuit TDC through one or more touch lines 230 to transfer driving signals and sensing signals.

As such, the touch display device according to embodiments of the disclosure may sense a touch in the mutual capacitance-based touch sensing scheme or self capacitance-based touch sensing scheme.

In the touch display device according to embodiments of the disclosure, the touch panel TSP may be of the embedded type in which the touch panel TSP is simultaneously manufactured when the display panel DISP is manufactured and is present inside the display panel DISP. In other words, the display panel DISP according to embodiments of the disclosure may embedded with the touch panel TSP.

Further, according to embodiments of the disclosure, the touch electrodes 320 and the touch lines 230 are electrodes and signal wires present inside the display panel DISP.

The display panel DISP of the touch display device according to embodiments of the disclosure may be of an organic light emitting diode (OLED) panel type.

Figure 5:
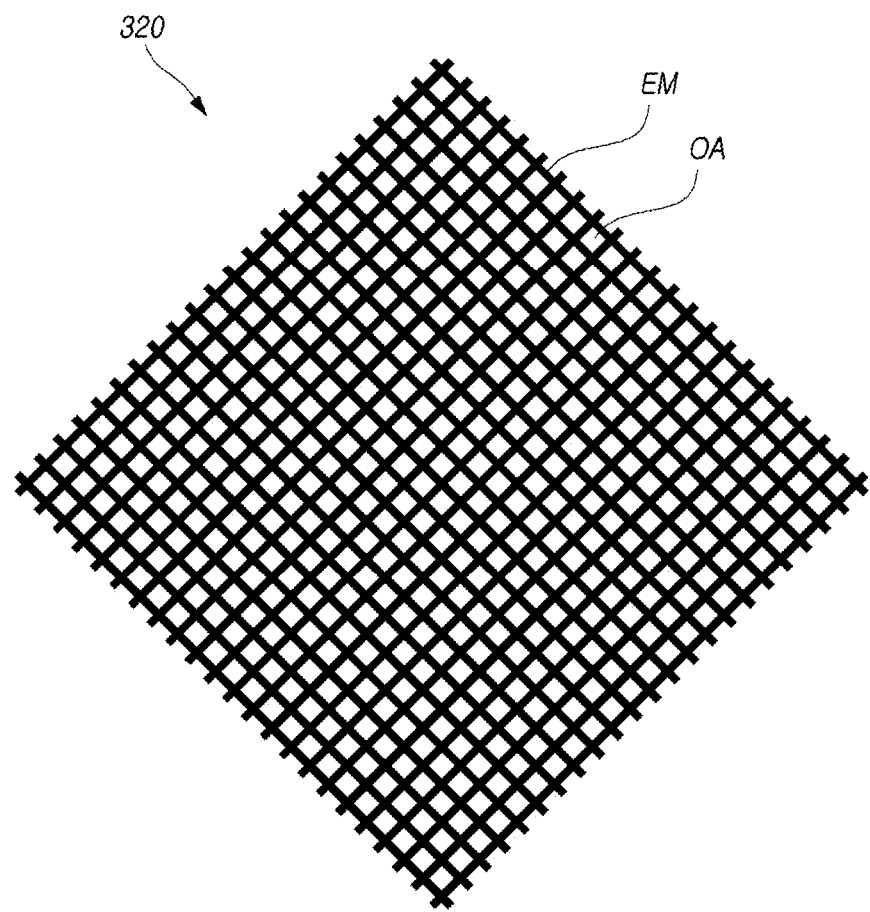
FIG. 5 is a view illustrating a mesh-type touch electrode disposed on a touch panel TSP in a flexible touch display device according to embodiments of the disclosure.

FIG. 5 is a view illustrating a mesh-type touch electrode disposed on a touch panel TSP in a flexible touch display device according to embodiments of the disclosure.

Referring to FIG. 5, in a flexible touch display device according to embodiments of the disclosure, each of a plurality of touch electrodes 320 disposed on a touch panel TSP may be of a mesh type.

The mesh-type touch electrode 320 may be formed of an electrode metal EM patterned in a mesh type.

Thus, a plurality of open areas OA may be present in the area of the mesh-type touch electrode 320.

Figure 6:
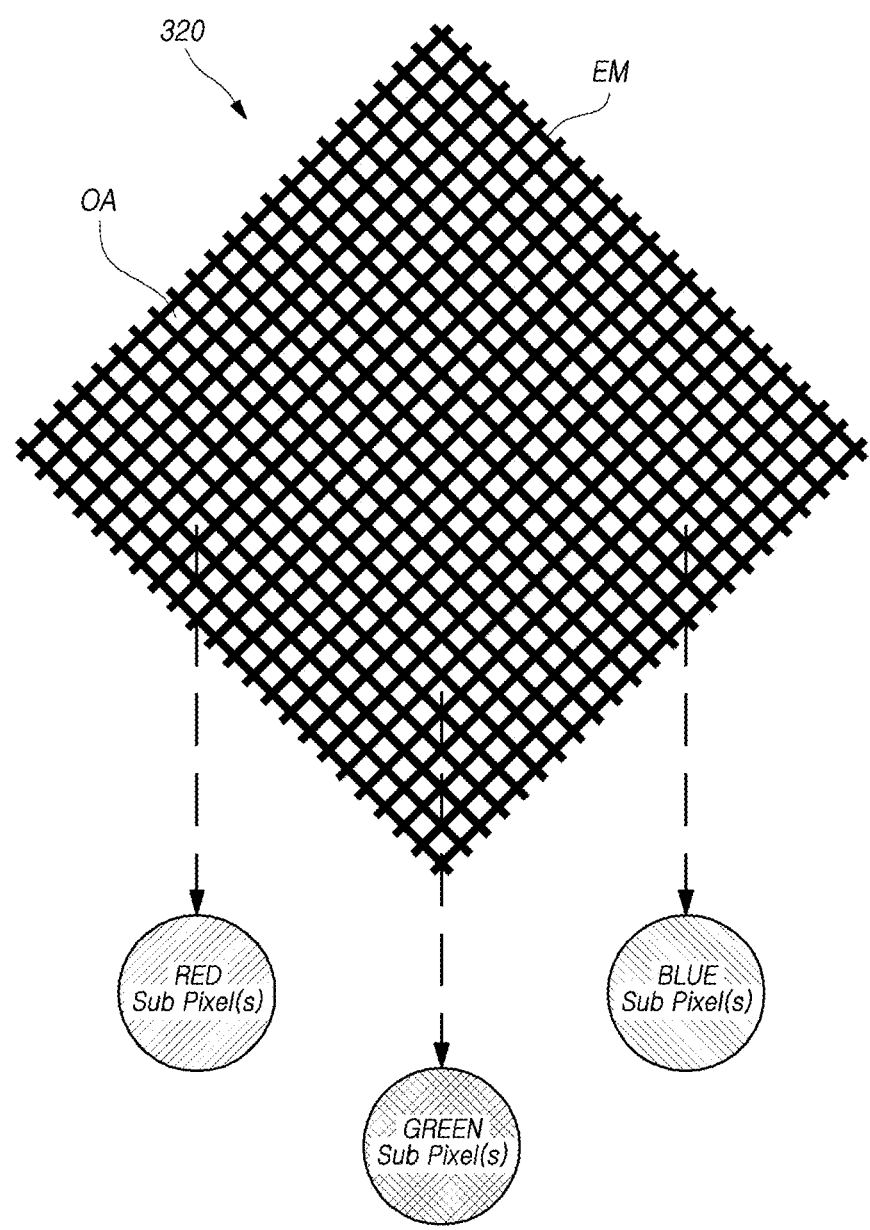
FIG. 6 is a view illustrating a correspondence between subpixels and a mesh-type touch electrode disposed on a touch panel TSP in a flexible touch display device according to embodiments of the disclosure.

FIG. 6 is a view illustrating a correspondence between subpixels and a mesh-type touch electrode disposed on a touch panel TSP in a flexible touch display device according to embodiments of the disclosure.

Referring to FIG. 6, each of a plurality of open areas OA present in the area of a touch electrode 320 formed of an electrode metal EM patterned in a mesh type may correspond to the light emitting area of one or more subpixels.

For example, each of the plurality of open areas OA present in the area of one touch electrode 320 may correspond to the light emitting area of one or more of a red subpixel, a green subpixel, and a blue subpixel.

As another example, each of the plurality of open areas OA present in the area of one touch electrode 320 may correspond to the light emitting area of one or more of a red subpixel, a green subpixel, a blue subpixel, and a white subpixel.

As described above, since the light emitting area of one or more subpixels is present in each of the open areas OA of each touch electrode 320 at plan view, the aperture ratio and light emitting efficiency of the display panel DISP may further be increased, with touch sensing enabled.

As described above, the contour of one touch electrode 320 may be substantially shaped as a diamond or rectangle (or square), and the open area OA which corresponds to a hole in one touch electrode 320 may also be shaped as a diamond or rectangle (or square).

However, given the shape of the subpixel, layout of the subpixels, and touch sensitivity, various changes or modifications in design may be made to the shape of the touch electrode 320 and the open area OA.

Described below is a subpixel structure (subpixel circuit) in a display panel for displaying images using organic light emitting diodes (OLEDs).

Figure 7:
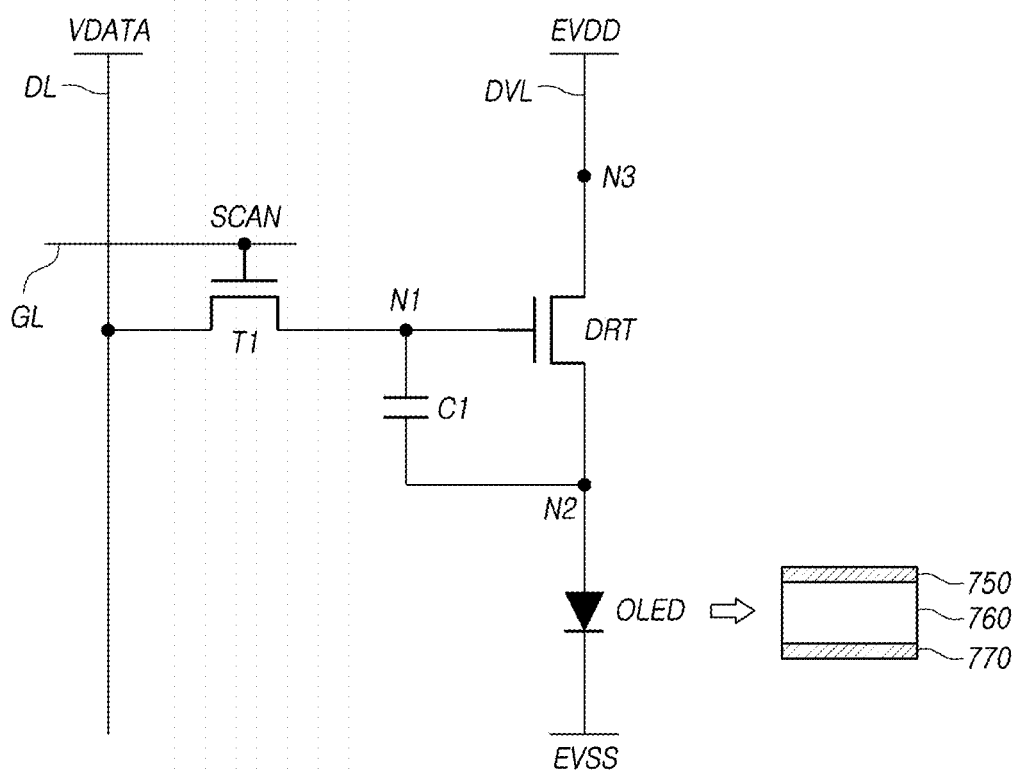
FIGS. 7 and 8 are views illustrating a subpixel circuit of a display panel according to embodiments of the disclosure.
Figure 8:
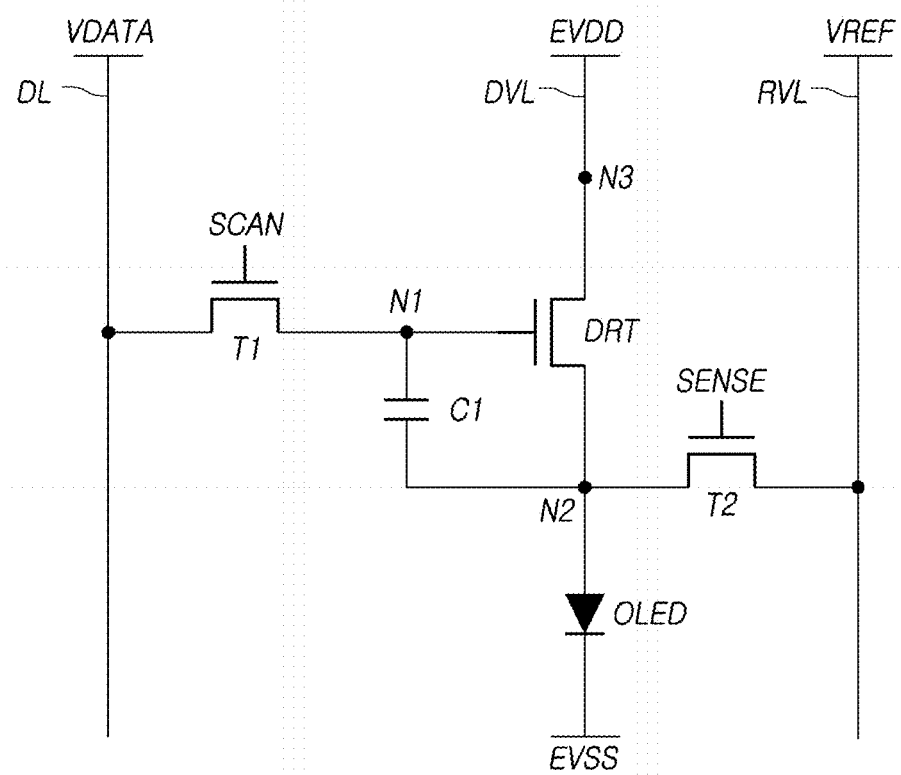

FIGS. 7 and 8 are views illustrating a subpixel circuit of a display panel according to embodiments of the disclosure.

Referring to FIGS. 7 and 8, each subpixel SP may basically include an organic light emitting diode (OLED) and a driving transistor DRT to drive the organic light emitting diode (OLED).

Referring to FIG. 7, each subpixel SP may further include a first transistor T1 to transfer data voltage VDATA to a first node N1, which corresponds to a gate node of the driving transistor DRT, and a storage capacitor C1 to maintain the data voltage VDATA corresponding to an image signal voltage or a voltage corresponding to the data voltage VDATA for the time of one frame.

The organic light emitting diode (OLED) may include a first electrode 750 (an anode electrode or cathode electrode), a light emitting layer 760, and a second electrode 770 (a cathode electrode or anode electrode).

As an example, a base voltage EVSS may be applied to the second electrode 770 of the organic light emitting diode (OLED).

The driving transistor DRT supplies a driving current to the organic light emitting diode (OLED), thereby driving the organic light emitting diode (OLED).

The driving transistor DRT includes the first node N1, second node N2, and third node N3.

The first node N1 of the driving transistor DRT is a node corresponding to the gate node and may be electrically connected with the source node or drain node of the first transistor T1.

The second node N2 of the driving transistor DRT may be electrically connected with the first electrode 750 of the organic light emitting diode (OLED) and may be the source node or drain node.

The third node N3 of the driving transistor DRT may be a node to which driving voltage EVDD is applied, be electrically connected with a driving voltage line DVL for supplying the driving voltage EVDD, and be the drain node or source node.

The driving transistor DRT and the first transistor T1 may be implemented as n-type transistors or p-type transistors.

The first transistor T1 may be electrically connected with the data line DL and the first node N1 of the driving transistor DRT and may receive, and be controlled by, a scan signal SCAN through the gate line and the gate node.

The first transistor T1 may be turned on by the scan signal SCAN, transferring the data voltage VDATA supplied from the data line DL to the first node N1 of the driving transistor DRT.

The storage capacitor C1 may be electrically connected between the first node N1 and second node N2 of the driving transistor DRT.

The storage capacitor C1 is an external capacitor intentionally designed to be outside the driving transistor DRT, but not a parasite capacitor (e.g., Cgs or Cgd) which is an internal capacitor present between the first node N1 and the second node N2 of the driving transistor DRT.

Referring to FIG. 8, according to embodiments of the disclosure, each subpixel disposed on the display panel may further include a second transistor T2 in addition to the organic light emitting diode (OLED), driving transistor DRT, first transistor T1, and storage capacitor C1.

The second transistor T2 may be electrically connected between the second node N2 of the driving transistor DRT and a reference voltage line RVL for supplying a reference voltage VREF and may receive, and be controlled by, a sensing signal SENSE, which is a kind of scan signal, through the gate node.

Adding the above-described second transistor T2 allows for effective control of the voltage state of the second node N2 of the driving transistor DRT in the subpixel SP.

The second transistor T2 is turned on by the sensing signal SENSE, applying the reference voltage VREF supplied through the reference voltage line RVL to the second node N2 of the driving transistor DRT.

The subpixel structure of FIG. 8 is advantageous in accurately initializing the voltage of the second node N2 of the driving transistor DRT and sensing the properties (threshold voltage or mobility) of the driving transistor DRT and the properties (e.g., threshold voltage) of the organic light emitting diode (OLED).

Meanwhile, the scan signal SCAN and the sensing signal SENSE may be separate gate signals. In this case, the scan signal SCAN and the sensing signal SENSE may be applied to the gate node of the first transistor T1 and the gate node of the second transistor T2, respectively, through different gate lines.

In some cases, the scan signal SCAN and the sensing signal SENSE may be the same gate signal. In this case, the scan signal SCAN and the sensing signal SENSE may be jointly applied to the gate node of the first transistor T1 and the gate node of the second transistor T2 through the same gate line.

Figure 9:
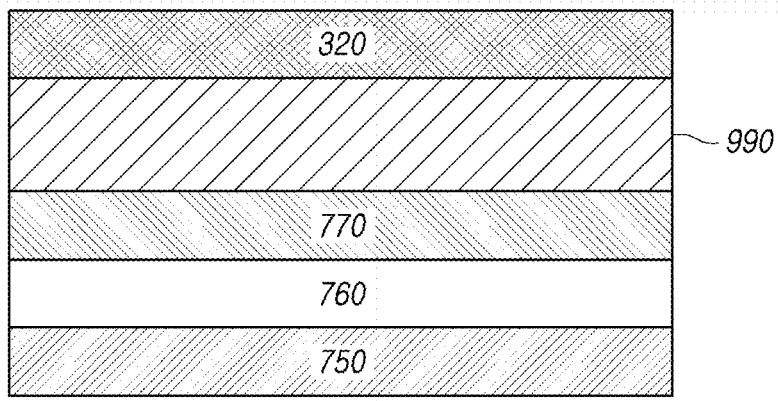
FIG. 9 is a view illustrating a position of a touch electrode in a display panel according to embodiments of the disclosure.

FIG. 9 is a view illustrating a position of a touch electrode in a display panel according to embodiments of the disclosure.

Referring to FIG. 9, in the display panel according to embodiments of the disclosure, the touch electrode 320 may be disposed on an encapsulation layer 990 positioned on the organic light emitting diode (OLED).

The encapsulation layer 990, as a layer to protect the organic material contained in the light emitting layer 760, from moisture or air, may be positioned on the second electrode 770 of the organic light emitting diode (OLED) which may be the cathode electrode.

The encapsulation layer 990 may be formed of a metal or an inorganic material or may be formed in a stacked structure of one or more organic insulation layers and one or more inorganic insulation layers.

As such, the touch structure in which the touch electrode 320 is formed on the encapsulation layer 990 is denoted a touch on encapsulation layer (TOE).

Meanwhile, a color filter layer may be further present between the encapsulation layer 990 and the touch electrode 320 or on the touch electrode 320.

Thus, a potential difference is created between the second electrode 770 and the touch electrode 320, forming a capacitance Cp.

The capacitance necessary for touch sensing is a capacitance between the touch electrodes 320 or a capacitance between the touch electrode 320 and the touching object (e.g., a finger or pen).

The brightness of the display panel DISP of the disclosure may be varied depending on the amount of the light emitted from the organic light emitting diodes (OLEDs) disposed in the active area A/A and extracted to the outside. In other words, as the amount of the light emitted from the OLEDs and extracted increases, the brightness of the display panel DISP may increase. Described below is the structure of a thin film transistor array film having a structure with enhanced light extraction.

At least one subpixel of the plurality of subpixels disposed in the active area may include at least one concave portion in the insulation film.

The organic light emitting display panel is described below in greater detail with reference to various figures.

Figure 10:
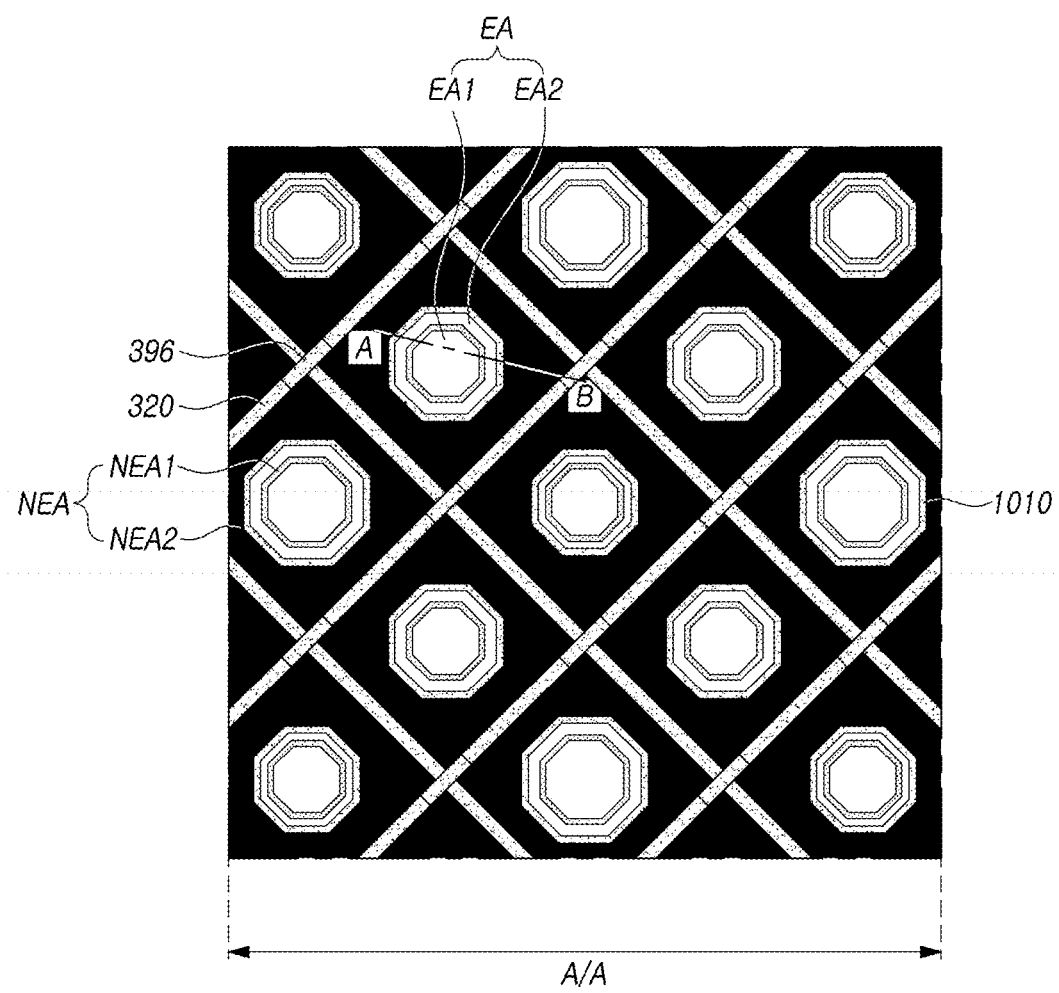
FIG. 10 is a plan view illustrating an emission area and a non-emission area included in an active area of an organic light emitting display panel according to embodiments of the disclosure.
Figure 11A:
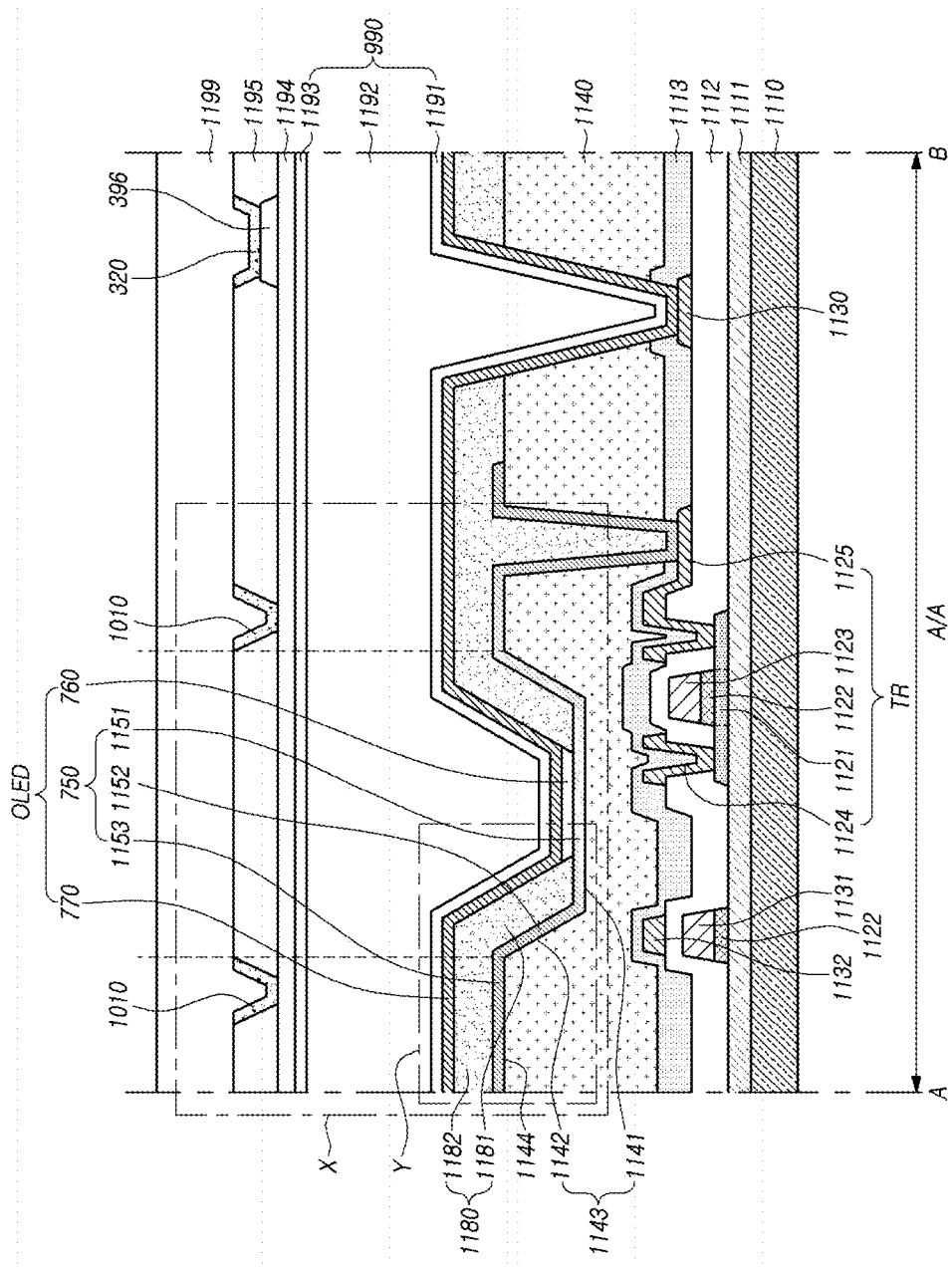
FIGS. 11A and 11B are cross-sectional views taken along line A-B of FIG. 10, illustrating a portion of an active area.
Figure 11B:
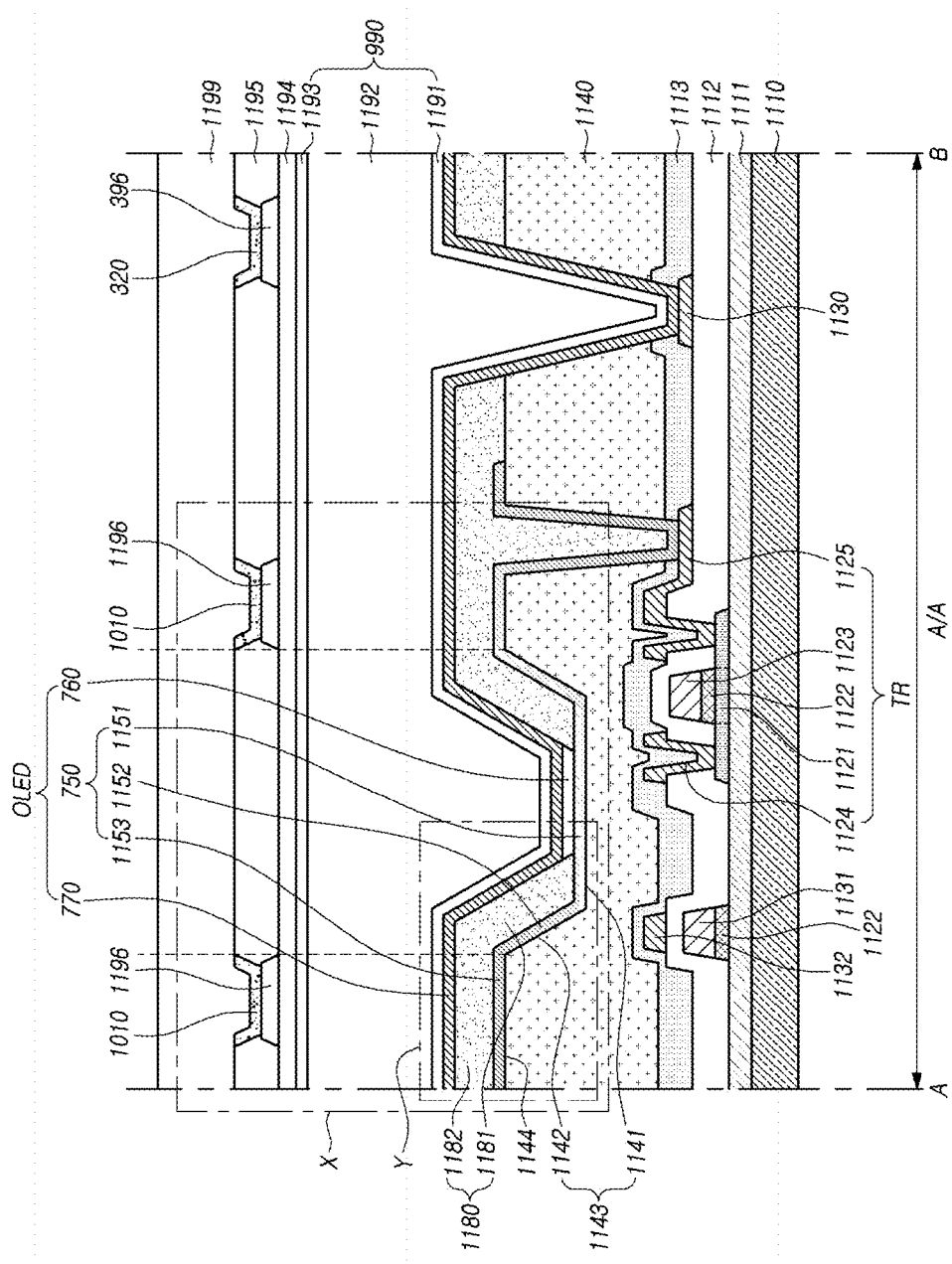

FIG. 10 is a plan view illustrating an emission area and a non-emission area included in an active area of an organic light emitting display panel according to embodiments of the disclosure. FIGS. 11A and 11B are cross-sectional views taken along line A-B of FIG. 10, illustrating a portion of an active area. FIGS. 11A and 11B may illustrate only a partial configuration and partial area disposed in one subpixel SP.

Referring to FIG. 10, a plurality of emission areas EA and a plurality of non-emission areas NEA are disposed in the active area A/A.

As shown in FIG. 10, the emission areas EA of at least two or more subpixels SP may have different sizes but embodiments of the disclosure are not limited thereto.

Each subpixel SP disposed in the active area A/A may include a plurality of emission areas EA, and at least one emission area EA may include a plurality of emission areas EA1 and EA2.

Specifically, the emission area EA of one subpixel SP may include a first emission area EA1 and a second emission area EA2 surrounding the first emission area EA1.

A first non-emission area NEA1 may be disposed between the first emission area EA1 and the second emission area EA2.

In other words, the first emission area EA1 and the second emission area EA2 may be differentiated from each other by the first non-emission area NEA1.

The first non-emission area NEA1 may be smaller in size than the first emission area EA1 and the second emission area EA2.

When the display device is in an on state, the first non-emission area NEA1 may be in a black state, or the first non-emission area NEA1 may have a lower brightness than the first and second emission areas EA1 and EA2 due to the light incident from at least one of the first emission area EA1 and the second emission area EA2.

As shown in FIG. 10, the first emission area EA1, second emission area EA2, and first non-emission area NEA1 each may be octagonal at plan view. However, embodiments of the disclosure are not limited thereto. For example, the first emission area EA1, second emission area EA2, and first non-emission area NEA1 each may be shaped as a circle, ellipse, or polygon, e.g., a triangle, square, or hexagon, or a combination thereof, in shape.

A pair of first and second emission areas EA1 and EA2 may be spaced apart from another pair of first and second emission areas EA1 and EA2, and the second non-emission area NEA2 may be disposed therebetween.

The second non-emission area NEA2 may be an area corresponding in whole or part to a circuit area where circuitry for driving the first and second emission areas EA1 and EA2 are disposed.

When the display device is in an on state, the second non-emission area NEA2 may be in a black state or may have a lower brightness than the first and second emission areas EA1 and EA2 due to the light incident from the second emission area EA2.

When the first non-emission area NEA1 and the second non-emission area NEA2 have a lower brightness than the first and second emission areas EA1 and EA2, the brightness of the first non-emission area NEA1 may be higher than the brightness of the second non-emission area NEA2, but embodiments of the disclosure are not limited thereto.

In the display device according to embodiments of the disclosure, a plurality of touch electrodes 320 (or touch wires) may be disposed in an area of the area where the second non-emission area NEA2 is disposed.

Thus, although the plurality of touch electrodes 320 include an opaque conductive material, since they do not overlap the emission area EA, the size of the emission area EA does not reduce.

Further, the display device according to the disclosure may include at least one light reflecting member 1010 disposed on the same layer as the plurality of touch electrodes 320.

The light reflecting member 1010 may be disposed to surround at least one second emission area EA2, allowing the light emitted from the organic light emitting diode (OLED) to be reflected and extracted to the outside of the display device.

Thus, the light reflecting member 1010 may have a shape corresponding to the second emission area EA2 at plan view. For example, the light reflecting member 1010 may be octagonal at plan view as shown in FIG. 10.

One light reflecting member 1010 may be disposed to surround one second emission area EA2 and to be spaced apart from another light reflecting member 1010.

The light reflecting member 1010 may be disposed in the second non-emission area NEA2. Thus, although the light reflecting member 1010 includes an opaque conductive material, since it does not overlap the emission area EA, a reduction in the size of the emission area EA may be prevented.

The light reflecting member 1010 may be disposed apart from the plurality of touch electrodes 320 as shown in FIG. 10. In other words, the light reflecting member 1010 may be in a state of being electrically separated from the plurality of touch electrodes 320. Thus, although a touch signal is applied to the plurality of touch electrodes 320, no touch signal may be applied to the light reflecting member 1010.

This is discussed below in detail with reference to FIGS. 11A and 11B.

Referring to FIGS. 11A and 11B, a transistor TR disposed on a substrate 1110 and an organic light emitting diode (OLED) electrically connected with the transistor TR are disposed in the active area A/A (the area taken along line A-B).

The transistor TR includes an active layer 1121, a gate electrode 1123, a source electrode 1124, and a drain electrode 1125.

The organic light emitting diode (OLED) includes a first electrode 750, an organic layer 760 including a light emission layer, and a second electrode 770. The first electrode 750 may be an anode electrode, and the second electrode 770 may be a cathode electrode, but embodiments of the disclosure are not limited thereto.

Specifically, a buffer layer 1111 is disposed on the substrate 1110. The active layer 1121 of the transistor TR is disposed on the buffer layer 1111. A gate insulation film 1122 is disposed on the active layer 1121, and a gate electrode 1123 is disposed on the gate insulation film 1122.

Although not shown in FIGS. 11A and 11B, the active layer 1121 may include a channel area, and the channel area of the active layer 1121 may overlap the gate insulation film 1122 and the gate electrode 1123, according to embodiments of the disclosure. In other words, the gate insulation film 1122 and the gate electrode 1123 may be disposed on the channel area of the active layer 1121.

An inter-layer insulation film 1112 is disposed on the gate electrode 1123. The source electrode 1124 and the drain electrode 1125 are disposed on the inter-layer insulation film 1112. The source electrode 1124 and the drain electrode 1125 may be spaced apart from each other on the inter-layer insulation film 1112. The source electrode 1124 and the drain electrode 1125 each may contact the active layer 1121 through a hole formed in the inter-layer insulation film 1112.

Although the transistor TR may be disposed on the substrate 1110 in the above-described structure, the transistor structure of the disclosure is not limited thereto.

For example, the gate electrode 1123 may be disposed on the substrate 1110, the active layer 1121 may be disposed on the gate electrode 1123, the source electrode 1124 may be disposed to overlap an end of the active layer 1121, and the drain electrode 1125 may be disposed to overlap the opposite end of the active layer 1121.

A protection film 1113 may be disposed while covering the transistor TR.

An insulation film 1140 may be disposed on the protection film 1113.

The insulation film 1140 may be formed of an organic material, but embodiments of the disclosure are not limited thereto.

The insulation film 1140 may have at least one concave portion 1143 in one subpixel area. The insulation film 1140 may have a surrounding portion 1144 that surrounds the concave portion 1143 and is positioned around the concave portion 1143. The concave portion 1143 may include a flat portion 1141 and an inclined portion 1142 surrounding the flat portion 1141.

The surface of the flat portion 1141 of the concave portion 1143 may be parallel with the surface of the substrate 1110, the inclined portion 1142 may surround the flat portion 1141, and a predetermined angle may be formed between the surface of the inclined portion 1142 and the surface of the substrate 1110. In other words, the surface of the inclined portion 1142 may be not parallel with the surface of the substrate 1110.

The insulation film 1140 may have a contact hole spaced apart from the concave portion 1143.

In at least one subpixel area, the first electrode 750 may be disposed on the concave portion 1143 and surrounding portion 1144 of the insulation film 1140.

In the area overlapping the concave portion 1143, the first electrode 750 includes a first area 1151 in which the top surface of the first electrode 750 is parallel with the surface of the substrate 1110 and a second area 1152 extending from the first area 1151. In the second area 1152, a predetermined angle is formed between the top surface of the first electrode 750 and the surface of the substrate 1110. In other words, the surface of the second area 1152 may be not parallel with the surface of the substrate 1110. The first electrode 750 includes a third area 1153 extending from the second area 1152 and, in the third area 1153, the top surface of the first electrode 750 is parallel with the surface of the substrate 1110. The third area 1153 may be an area overlapping the surrounding portion 1144 of the insulation film 1140.

As described above, in at least one subpixel area, the insulation film 1140 may include at least one contact hole spaced apart from the concave portion 1143, and the transistor TR may be electrically connected with the first electrode 750 of the organic light emitting diode (OLED) through the contact hole of the insulation film 1140.

Specifically, the first electrode 750 may be electrically connected with the source electrode 1124 or drain electrode 1125 of the transistor TR.

A bank 1180 may be disposed on portions of the insulation film 1140 and the first electrode 750 as shown in FIGS. 11A and 11B.

The bank 1180 may include a first portion 1181 disposed on the first electrode 750 in an area corresponding to a portion of the concave portion 1143 of the insulation film 1140 and a second portion 1182 disposed on the insulation film 1140 and the first electrode 750 in an area corresponding to the surrounding portion 1144 of the insulation film 1140.

The bank 1180 may be disposed to expose a portion of the top surface of the first electrode 750 in the area corresponding to the concave portion 1143. In other words, at least one subpixel may have an area in which the first electrode 750 does not overlap the bank 1180.

The organic layer 760 of the organic light emitting diode (OLED) with at least one emission layer may be disposed on the first electrode 750 not overlapping the bank 1180. The organic layer 760 may be disposed on the first electrode 750 and the bank.

The second electrode 770 of the OLED may be disposed on the organic layer 760.

The organic layer 760 of the organic light emitting diode (OLED) may be formed by deposition or coating featuring straightness. For example, the organic layer 760 may be formed by physical vapor deposition (PVD), e.g., evaporation.

Formed by the method, the organic layer 760 may have a first thickness in an area having a predetermined angle from the horizontal surface and a second thickness in an area parallel with the horizontal surface, wherein the first thickness is smaller than the second thickness.

For example, the thickness of the organic layer 760 disposed in the area corresponding to the inclined portion 1142 of the concave portion 1143 may be smaller than the thickness of the organic layer 760 disposed on the top surface of the first electrode 750 exposed by the bank 1180. Further, the thickness of the organic layer 760 disposed in the area corresponding to the inclined portion 1142 of the concave portion 1143 may be smaller than the thickness of the organic layer 760 disposed on the surrounding portion 1144.

Thus, when the organic light emitting diode (OLED) is driven, the area where the thickness of the organic layer 760 is relatively small, i.e., the area corresponding to the inclined portion 1142 of the concave portion 1143, may have the highest current density, and a strong electric field may be applied to the area corresponding to the inclined portion 1142 of the concave portion 1143.

The light emission characteristics of the organic light emitting diode (OLED) in the area corresponding to the inclined portion 1142 of the concave portion 1143 may be rendered to differ from the light emission characteristics of the organic light emitting diode (OLED) in the area corresponding to the flat portion 1141 of the concave portion 1143, and the OLED may be deteriorated.

According to an embodiment of the disclosure, as the bank 1180 is disposed to cover the inclined portion 1142 of the concave portion 1143, the OLED may not be formed in the area corresponding to the inclined portion 1142 of the concave portion 1143, so the deterioration of the OLED and the phenomenon that the light emission characteristics are rendered to differ per area may be prevented.

However, the thickness conditions for the organic layer 760, according to embodiments of the disclosure, are not limited thereto, but the organic layer 760 may rather have a corresponding thickness per position.

Meanwhile, the first electrode 750 may include a light reflective metal. Although FIGS. 11A and 11B illustrate a configuration in which the first electrode 750 is a single layer, embodiments of the disclosure are not limited thereto, but the first electrode 750 may be formed in a multi-layer structure. When the first electrode 750 has a multi-layer structure, at least one layer may include a light reflective metal.

For example, the first electrode 750 may include, but is not limited to, at least any one of aluminum, neodymium, nickel, titanium, tantalum, copper (Cu), silver (Ag), and an aluminum alloy.

The second electrode 770 may include a light-transmissive or semi-light transmissive, conductive material. For example, the second electrode 770 may include at least one kind of transparent, conductive oxide, such as indium tin oxide (ITO), indium zinc oxide (IZO), indium tin zinc oxide (ITZO), zinc oxide, or tin oxide, or may include a semi-light transmissive metal, such as magnesium, silver (Ag), or an alloy of magnesium and silver.

When the second electrode 770 includes a semi-light transmissive metal, the thickness of the second electrode 770 may be smaller than the thickness of the first electrode 750.

As shown in FIGS. 11A and 11B, an auxiliary electrode 1130 (which may also be referred to as an auxiliary wire) contacting the second electrode 770 may further be disposed in the area corresponding to the second non-emission area NEA2 in the active area A/A.

Specifically, the auxiliary electrode 1130 may be disposed on the inter-layer insulation film 1112. The protection film 1113, insulation film 1140, and bank 1180 may have a hole to expose the auxiliary electrode 1130. The second electrode 770 may contact the auxiliary electrode 1130 through the hole formed in the protection film 1113, insulation film 1140, and bank 1180 to expose the auxiliary electrode 1130.

When the organic light emitting display panel is a large-size display panel, a voltage drop may occur due to the resistance of the second electrode 770, causing a difference in brightness between the periphery and center of the panel. However, in the organic light emitting display panel, according to the disclosure, the auxiliary electrode 1130 contacting the second electrode 770 may prevent a voltage drop. This may prevent a difference in brightness which may arise when the organic light emitting display panel is a large-size panel.

Although FIGS. 11A and 11B illustrate a configuration in which one auxiliary electrode 1130 is disposed in each subpixel SP, embodiments of the disclosure are not limited thereto. For example, one auxiliary electrode 1130 may be disposed per multiple subpixels SP.

The position of the auxiliary electrode 1130 shown in FIGS. 11A and 11B is merely an example and is not limited thereto.

Unless the organic light emitting display panel according to an embodiment of the disclosure is a large-size panel, the auxiliary electrode 1130 may be omitted.

As shown in FIGS. 11A and 11B, a storage capacitor Cst may be disposed in the active area A/A. The storage capacitor Cst may include a first storage capacitor electrode 1131 disposed on the same layer as the gate electrode 1123 and a second storage capacitor electrode 1132 disposed on the same layer as the source electrode 1124 and the drain electrode 1125, but the structure of the storage capacitor Cst of the disclosure is not limited thereto.

At least one encapsulation layer 990 may be disposed on the second electrode 770 of the OLED.

For example, the encapsulation layer 990 may include a first encapsulation layer 1191 disposed on the second electrode 770, a second encapsulation layer 1192 disposed on the first encapsulation layer 1191, and a third encapsulation layer 1193 disposed on the second encapsulation layer 1192.

As such, when the encapsulation layer 990 is formed in a multi-layered structure, at least one layer thereof may include an inorganic insulation material, and at least one other layer thereof may include an organic insulation material.

According to an embodiment of the disclosure, although the first encapsulation layer 1191 and the second encapsulation layer 1193 include an inorganic insulation material, and the second encapsulation layer 1192 includes an organic insulation material, embodiments of the disclosure are not limited thereto.

The encapsulation layer 990 may be disposed on the organic light emitting diode (OLED) to prevent infiltration of moisture or foreign bodies into the organic light emitting diode (OLED).

Although FIGS. 11A and 11B illustrate a configuration in which the encapsulation layer 990 is disposed in the active area A/A, embodiments of the disclosure are not limited thereto, but the encapsulation layer 990 may rather extend up to a portion of the non-active area N/A.

A first touch buffer layer 1194 may be disposed on the third encapsulation layer 1193.

A plurality of bridge patterns 396 may be disposed on the first touch buffer layer 1194, and a second touch buffer layer 1195 may be disposed on the bridge patterns 396.

A plurality of touch electrodes 320 may be disposed on the second touch buffer layer 1195. The plurality of touch electrodes 320 may contact the bridge pattern 396 through a hole formed in the second touch buffer layer 1195.

The plurality of touch electrodes 320 may be transparent or opaque electrodes.

At least one light reflecting member 1010 may be disposed in the hole formed in the second touch buffer layer 1195. As shown in FIG. 11A, the light reflecting member 1010 may be disposed in the hole formed in the second touch buffer layer 1195 and on the first touch buffer layer 1194.

The position of the light reflecting member 1010 according to the disclosure is not limited thereto. As shown in FIG. 11B, at least one light reflecting member 1010 may be disposed on the same layer as the plurality of touch electrodes 320.

Referring to FIG. 11B, the pattern 1196 same as the bridge pattern 396 disposed under the touch electrode 320 may be disposed under the light reflecting member 1010. The pattern 1196 disposed under the light reflecting member 1010 may be formed in the process in which the bridge pattern 396 disposed under the touch electrode 320 is formed, but embodiments of the disclosure are not limited thereto.

The light reflecting member 1010 may be disposed apart from the plurality of touch electrodes 320. A planarization film 1199 may be disposed on the second touch buffer layer 1195, the plurality of touch electrodes 320, and the plurality of light reflecting members 1010.

Although the light reflecting member 1010 includes a light reflecting metal, embodiments of the disclosure are not limited thereto.

One end of the light reflecting member 1010 may be disposed to overlap the bank 1180.

The top area of the first electrode 750 of the organic light emitting diode (OLED), which is exposed by the bank 1180, may be an area corresponding to the first emission area EA1.

As described above in connection with FIG. 10, the light reflecting member 1010 may be disposed to surround the second emission area EA2.

In this case, the light reflecting member 1010 may be disposed to overlap the bank 1180.

One end of the light reflecting member 1010 may be disposed to correspond to the boundary between the inclined portion 1142 and the flat portion 1144 of the insulation film 1140. In other words, the light reflecting member 1010 may not overlap the first and second emission areas EA1 and EA2.

The light reflecting member 1010 may allow the light emitted from the first emission area EA1 to be extracted to the outside of the display device while being prevented from reaching other subpixel SP.

In the display device of the disclosure, which includes at least one concave portion 1143 in the insulation film 1140 and the light reflecting member 1010, the path of the light emitted from the organic light emitting diode (OLED) is discussed below with reference to FIGS. 12 and 13.

Figure 12:
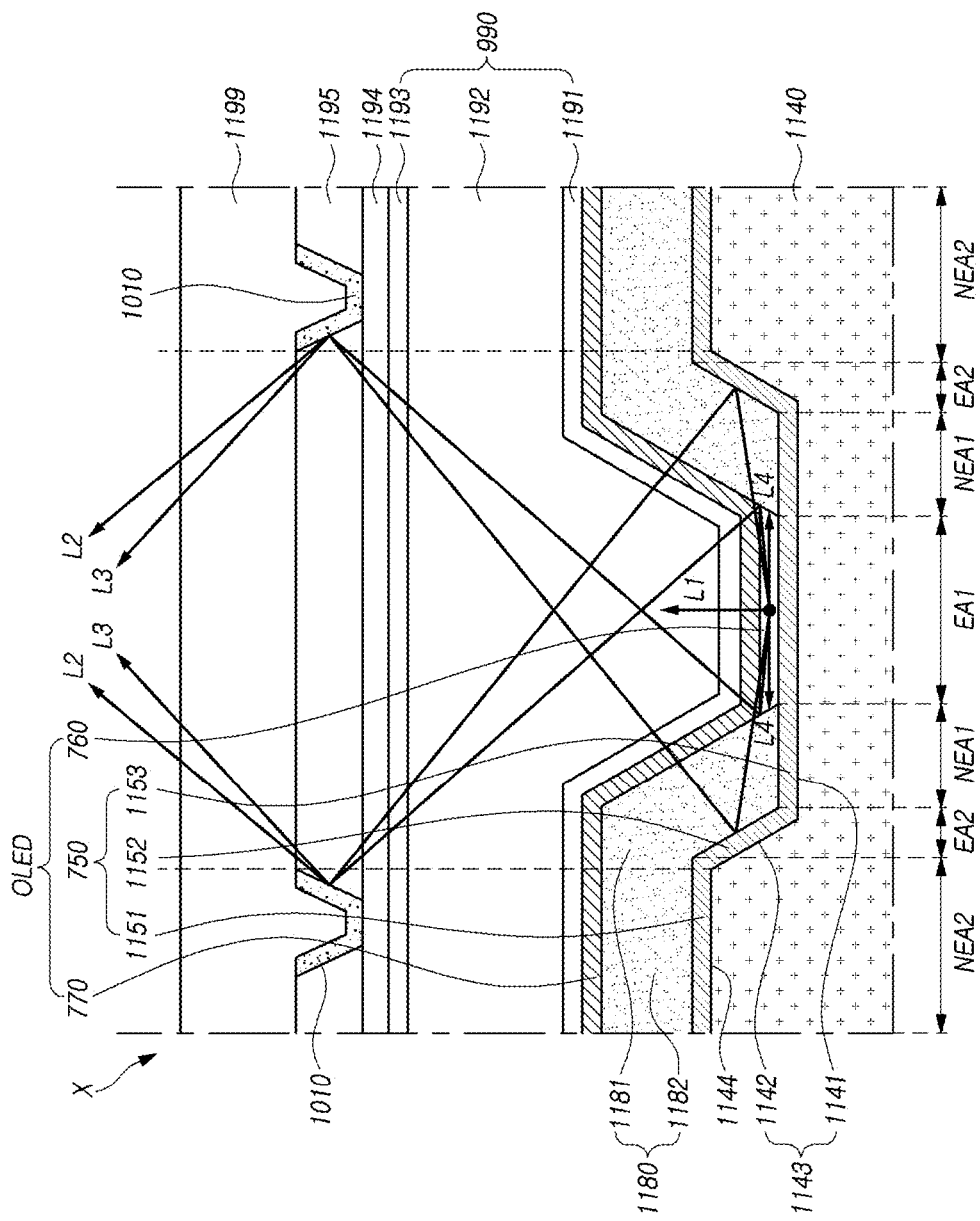
FIG. 12 is an enlarged view illustrating area X of FIGS. 11A and 11B.

FIG. 12 is an enlarged view illustrating area X of FIGS. 11A and 11B. FIG. 13 is an enlarged view illustrating area Y of FIGS. 11A and 11B.

Substantially the same configurations and effects as those described above are not repeatedly described below.

Referring to FIG. 12, at least one subpixel SP may include at least one emission area EA, and one emission area EA may include at least two emission areas EA1 and EA2. One non-emission area NEA1 may be disposed between the two emission areas EA1 and EA2.

Specifically, a first emission area EA1 may be an area corresponding to a portion of the concave portion 1143 of the insulation film 1140.

In another aspect, the first emission area EA1 may be an area that does not overlap the first portion 1181 of the bank 1180 in the flat portion 1141 of the concave portion 1143.

The first emission area EA1 may be an area in which part L1 of the light emitted from the organic layer 760 is extracted via the organic layer 760 and the second electrode 770 to the outside of the display device.

The first emission area EA1 may be an area in which part L1 (which may be hereinafter referred to as first light) of the light emitted from the organic layer 760 arrives at the first electrode 750, is reflected by the first electrode 750, and is extracted via the organic layer 760 and the second electrode 770 to the outside of the display device.

Specifically, the first light L1 emitted from the organic layer 760 sequentially passes through the second electrode 770 of the organic light emitting diode (OLED) and the encapsulation layer 990 and be extracted to the outside of the display device.

The first emission area EA1 may be surrounded by the first non-emission area NEA1.

The first non-emission area NEA1 may correspond to the area in which the bank 1180 overlaps the flat portion 1141 of the concave portion 1143. Specifically, the first non-emission area NEA1 may correspond to the area in which the first portion 1181 of the bank 1180 overlaps the flat portion 1141 of the concave portion 1143.

The first non-emission area NEA1 may be an area in which part L4 of the light emitted from the organic layer 760 is directed to the first portion 1181 of the bank 1180 but the light L4 may not be extracted to the outside. In other words, the first non-emission area NEA1 may be an area in which the light emitted from the organic layer 760 in the direction parallel with the flat portion 1141 arrives at the first portion 1181 of the bank 1180 but is trapped in the subpixel rather than reflected to the outside.

When the display device is in an on state, the first non-emission area NEA1 may be in a black state, or the first non-emission area NEA1 may have a lower brightness than the first and second emission areas EA1 and EA2 due to the light incident from at least one of the first emission area EA1 and the second emission area EA2. For example, the first non-emission area NEA1 disposed between the first emission area EA1 and second emission area EA2 may be an area where the visible rays from the first emission area EA1 and the visible rays from the second emission area EA2 are mixed, but embodiments of the disclosure are not limited thereto.

The second emission area EA2 may be disposed to surround the first non-emission area NEA1. The second emission area EA2 may be an area in which the first electrode 750 overlaps the inclined portion 1142 of the concave portion 1143. In another aspect, the second emission area EA2 may be an area corresponding to the second area 1152 of the first electrode 750.

Part L2 (which may be hereinafter referred to as second light) of the light emitted from the organic layer 760 may be directed to the first portion 1181 of the bank 1180.

In the organic light emitting display device according to embodiments of the disclosure, the refractive index of the bank 1180 may be smaller than the refractive index of the organic layer 760 of the organic light emitting diode (OLED).

For example, the refractive index of the bank 1180 may range from 1.4 to 1.55.

The refractive index of the organic layer 760 may range from 1.7 to 1.8.

Thus, part L2 of the light emitted from the organic layer 760 may be total-reflected on the interfacial surface between the bank 1180 and the organic layer 760, and is extracted through the second electrode 770, encapsulation layer 990, first and second touch buffer layers 1194 and 1195 to the outside.

Meanwhile, the refractive index of the encapsulation layer 990 and the first and second touch buffer layers 1194 and 1195 may be larger than the bank 1180.

For example, the refractive index of the first and third encapsulation layers 1191 and 1193 may range from 1.8 to 1.9.

The refractive index of the second encapsulation layer 1192 may range from 1.6 to 1.7.

The refractive index of the first and second touch buffer layers 1194 and 1195 may range from 1.7 to 1.9.

The refractive index of the planarization film 1199 disposed on the second touch buffer layer 1195 may range from 1.5 to 1.6.

According to embodiments of the disclosure, the refractive index of the second encapsulation layer 1192 may be larger than the refractive index of the bank 1180 and the planarization film 1199.

The refractive index of the bank 1180 may be smaller than the refractive index of the organic layer 760, encapsulation layer 990, and first and second touch buffer layers 1194 and 1195.

Thus, the light total-reflected on the interfacial surface between the organic layer 760 and the bank 1180 may be prevented from being trapped in the display device.

Part of the second light L2 transmitted through the second touch buffer layer 1195 may be extracted to the outside of the display device.

The rest of the second light L2 may reach the light reflecting member 1010 disposed on the second touch buffer layer 1195 and be reflected by the light reflecting member 1010 and extracted to the outside of the display device.

In the display device according to embodiments of the disclosure, the light reflecting member 1010 may be disposed to surround the second emission area EA2 to enhance the light extraction efficiency as described above.

In this case, the light reflecting member 1010 plays a role to prevent light leaks that occur as the light emitted from one subpixel SP goes over to other subpixel SP which emits a different color of light while enhancing the light extraction efficiency of the display device.

The rest L3 (which may be hereinafter referred to as third light) of the light emitted from the organic layer 760 may be directed to the second area 1152 of the first electrode 750.

The third light L3 may be light that is not total-reflected on the interfacial surface between the bank 1180 and the organic layer 760 but enters the bank 1180.

The third light L3 travels through the first portion 1181 of the bank 1180 to the second area 1152 of the first electrode 750. Upon reaching the first electrode 750, the third light L3 is reflected by the first electrode 750 and passes through the first portion 1181 of the bank 1180 and the organic layer 760 and reaches the second electrode 770.

Thereafter, part of the third light L3 may be extracted through the second electrode 770, encapsulation layer 990, and first and second touch buffer layers 1194 and 1195 to the outside of the display device.

The rest of the third light L3 may reach the light reflecting member 1010 disposed on the second touch buffer layer 1195 and be reflected by the light reflecting member 1010 and extracted to the outside of the display device.

As described above, as at least one light reflecting member 1010 is disposed in the second non-emission area NEA2, light leakage of the organic light emitting display device may be suppressed, and the light extraction efficiency may be enhanced.

Part of the second and third light L2 and L3 is extracted in the first emission area EA1, and the rest may be extracted in the second emission area EA2, but embodiments of the disclosure are not limited thereto.

Part of the second and third light L2 and L3 may also be extracted in the first non-emission area NEA1. However, in such a case, the brightness of the first non-emission area NEA1 may be lower than the brightness of the first and second emission areas EA1 and EA2.

The second non-emission area NEA2 may be disposed to surround the second emission area EA2. The second non-emission area NEA2 may correspond to the area in which the second portion 1182 of the bank 1180 is disposed.

In the organic light emitting display panel according to embodiments of the disclosure, the inclined portion 1142 of the concave portion 1143 and the bank 1180 disposed on the inclined portion 1142 of the concave portion 1143 may have specific conditions to increase the amount of light extracted from the second emission area EA2.

Figure 13:
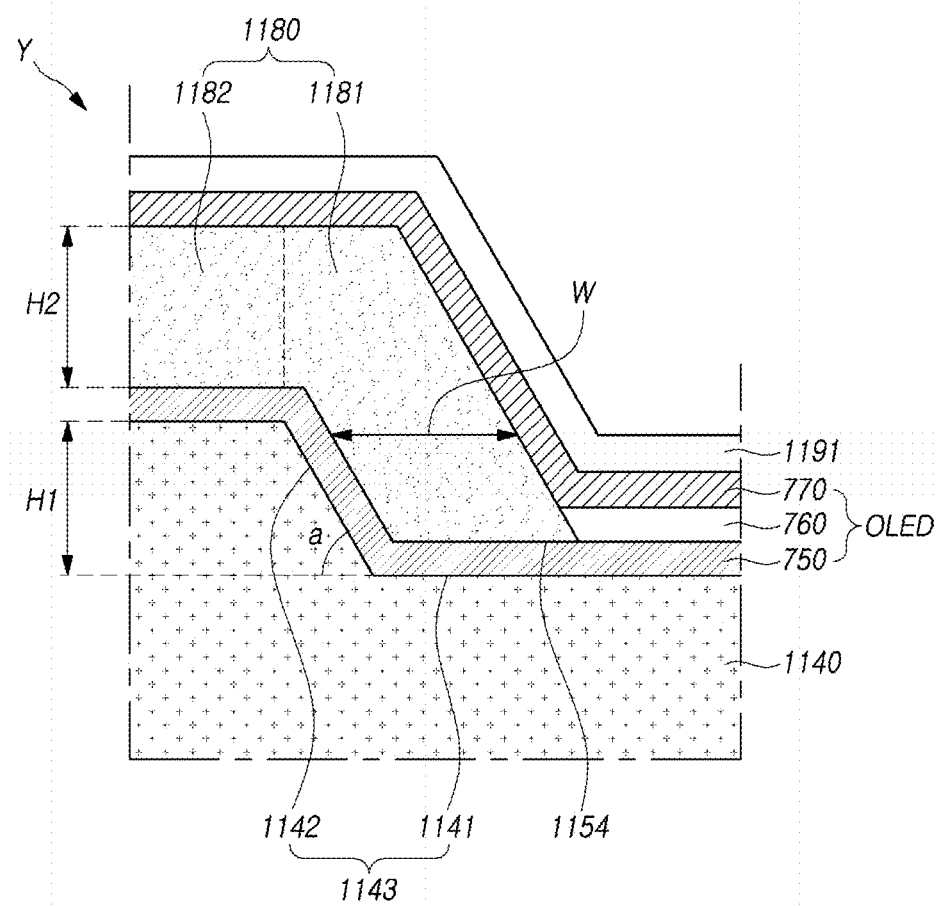
FIG. 13 is an enlarged view illustrating area Y of FIGS. 11A and 11B.

Referring to FIG. 13, the height H1 of the inclined portion 1142 of the insulation film 1140 (or the depth of the concave portion) may be 0.7 μm or more. The height H1 of the inclined portion 1142 means the minimum distance from the line extending in parallel with the surface of the substrate 1110, from the surface of the flat portion 1141 of the concave portion 1143 to the surrounding portion 1144

According to an embodiment of the disclosure, the height H1 of the inclined portion 1142 of the insulation film 1140 is not limited to the above-described value. For example, the height H1 may be any height at which the components under the insulation film 1140 are not exposed by the concave portion 1143 of the insulation film 1140.

The height H1 of the inclined portion 1142 may be larger than the height H2 of the bank 1180 disposed on the surrounding portion 1144. In another aspect, the height H1 of the inclined portion 1142 may be larger than the height H2 of the second portion 1182 of the bank 1180.

As such, as the height H1 of the inclined portion 1142 increases, the amount of light reflected in the second area 1152 of the first electrode 750 increases, enhancing light extraction efficiency.

The angle a between the inclined portion 1142 of the concave portion 1143 and the horizontal surface may be not less than 27° and less than 80°.

When the angle a is less than 27°, the light emitted from the organic layer 760 may fail to arrive at the first electrode 750 disposed on the inclined portion 1142 but may rather be delivered to another adjacent subpixel, causing color mixing, or may be trapped in the display device without being extracted to the outside.

When the angle a exceeds 80°, an open circuit may occur in, e.g., the first electrode 750 disposed on the inclined portion 1142 of the insulation film 1140.

In the area corresponding to the inclined portion 1142 of the concave portion 1143, the distance W between the surface of the bank 1180 and the first electrode 750 may be not more than 3.2 μm, not more than 2.6 μm, or not more than 2.0 μm.

In another aspect, the distance W between the surface of the bank 1180 and the first electrode 750 in the second area 1152 of the first electrode 750 may be not more than 3.2 μm, not more than 2.6 μm, or not more than 2.0 μm.

As W decreases, the first emission area EA1 may be expanded, and the optical path of the light reflected and extracted from the second area 1152 of the first electrode 750 may be shortened, enhancing light extraction efficiency. The lower limit of W, although not particularly limited, may be not less than 0.1 μm, not less than 0.3 μm, or not less than 0.5 μm.

By adjusting the range of W as above, the first emission area EA1 may be enlarged, and light extraction efficiency may be enhanced in the organic light emitting display panel.

The color coordinates of the first emission area EA1 may differ from, or correspond to, the color coordinates of the second emission area EA2.

For example, if the third light L3 takes up a larger proportion of the light emitted from the second emission area EA2, the color coordinates of the first emission area EA1 may differ from the color coordinates of the second emission area EA2.

The third light L3 is light extracted to the outside of the display device through the bank 1180. When the bank 1180 contains a colored organic material or inorganic material, the color coordinates of the second emission area EA2 may shift to a longer wavelength than the color coordinates of the first emission area EA1.

As described above, the light reflecting member 1010 which may enhance light extraction efficiency while suppressing light leakage may be disposed on the same layer as the plurality of touch electrodes 320.

Although the plurality of touch electrodes 320 may be connected with the touch line, the light reflecting member 1010 may have a structure of having been electrically separated from the touch line. Thus, the light reflecting member 1010 may enhance light extraction efficiency without affecting touch-related signals.

The layout structure of the plurality of touch electrodes 320, light reflecting member 1010, and touch line is discussed below with reference to FIG. 14.

Figure 14:
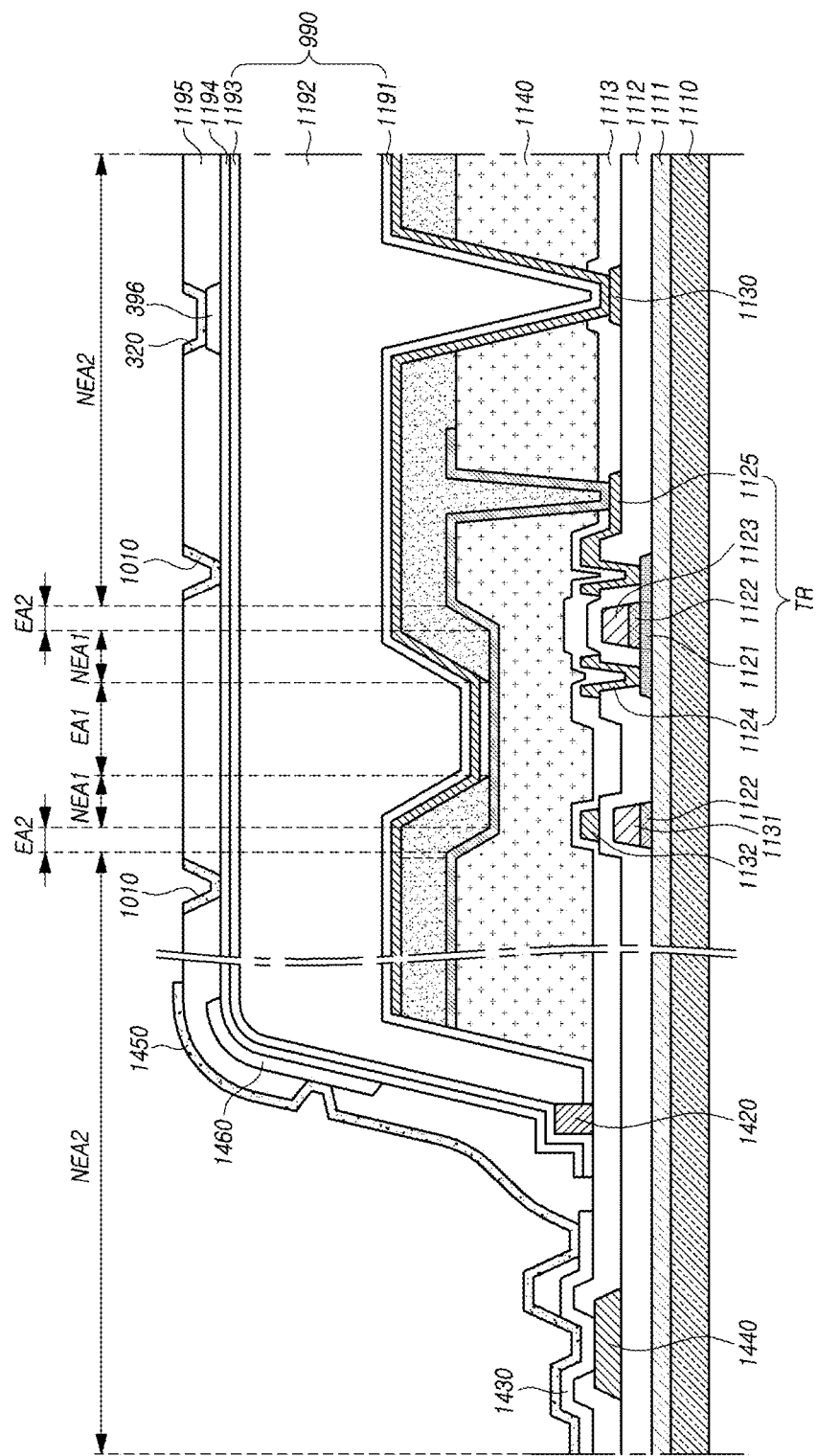
FIG. 14 is a view illustrating a portion of an active area and a non-active area extending from the active area.

FIG. 14 is a view illustrating a portion of an active area and a non-active area extending from the active area.

Substantially the same configurations and effects as those described above are not repeatedly described below.

Referring to FIG. 14, a plurality of touch electrodes 320, at least one light reflecting member 1010, and touch line 1450 may be disposed on the second touch buffer layer 1195.

The touch electrodes 320 disposed along the same row (or the same column) may be electrically connected together via a bridge pattern 396, forming one driving touch electrode line or one sensing touch electrode line.

Although FIG. 14 illustrates a configuration in which the touch electrode 320 and the touch line 1450 are positioned on the same layer, embodiments of the disclosure are not limited thereto. For example, the touch electrode 320 and the touch line 1450 may also be positioned on different layers.

The touch line 1450 may be electrically connected with an auxiliary line 1460 disposed on the same layer as the bridge pattern 396. Specifically, as shown in FIG. 14, the touch line 1450 may contact the auxiliary line 1460 disposed under the second touch buffer layer 1195 via a contact hole formed in the second touch buffer layer 1195.

As the touch line 1450 is electrically connected with the auxiliary line 1460, the resistance of the touch line 1450 may be reduced.

The touch line 1450 and the touch electrode 320 may be electrically connected with each other. The touch line 1450 is positioned on a dam 1420 and extends up to a pad portion positioned at the periphery of the dam 1420. The touch line 1450 is electrically connected with the pad portion.

Specifically, the touch line 1450 may be electrically connected with a pad 1440 positioned in the pad portion PAD provided in the non-active area N/A. Although FIG. 14 illustrates that the touch line 1450 is electrically connected with the pad 1440 through a pad connection line 1430, embodiments of the disclosure are not limited thereto. For example, the pad 1440 and the touch line 1450 may be directly connected together.

The pad 1440 connected with the touch line 1450 may be connected with the touch sensing circuit TSC. The touch sensing circuit TSC may supply a touch driving signal to at least one of the plurality of touch electrodes 320 and sense at least one of the presence or absence of a touch and the position of a touch in response to the touch driving signal.

The touch line 1450, third encapsulation layer 1193, and first and second touch buffer layers 1194 and 1195 may be disposed to overlap on the dam 1420. However, this structure is merely an example. The touch line 1450 may overlap at least one component of the third encapsulation layer 1193 and the first and second touch buffer layers 1194 and 1195 on the dam 1420.

Although FIG. 14 illustrates a structure in which one dam 1420 is provided, embodiments of the disclosure are not limited thereto. According to the disclosure, the number of dams 1420 may be properly varied depending on the size of the display device. In other words, there may be provided two or more dams 1420 and, when a plurality of dams 1420 are disposed on the substrate 1110, at least two dams may have different heights.

Although FIGS. 11A and 11B, 12, 13, and 14 illustrate a structure in which the touch electrode 320 is connected via the bridge pattern 396, embodiments of the disclosure are not limited thereto.

Figure 15:
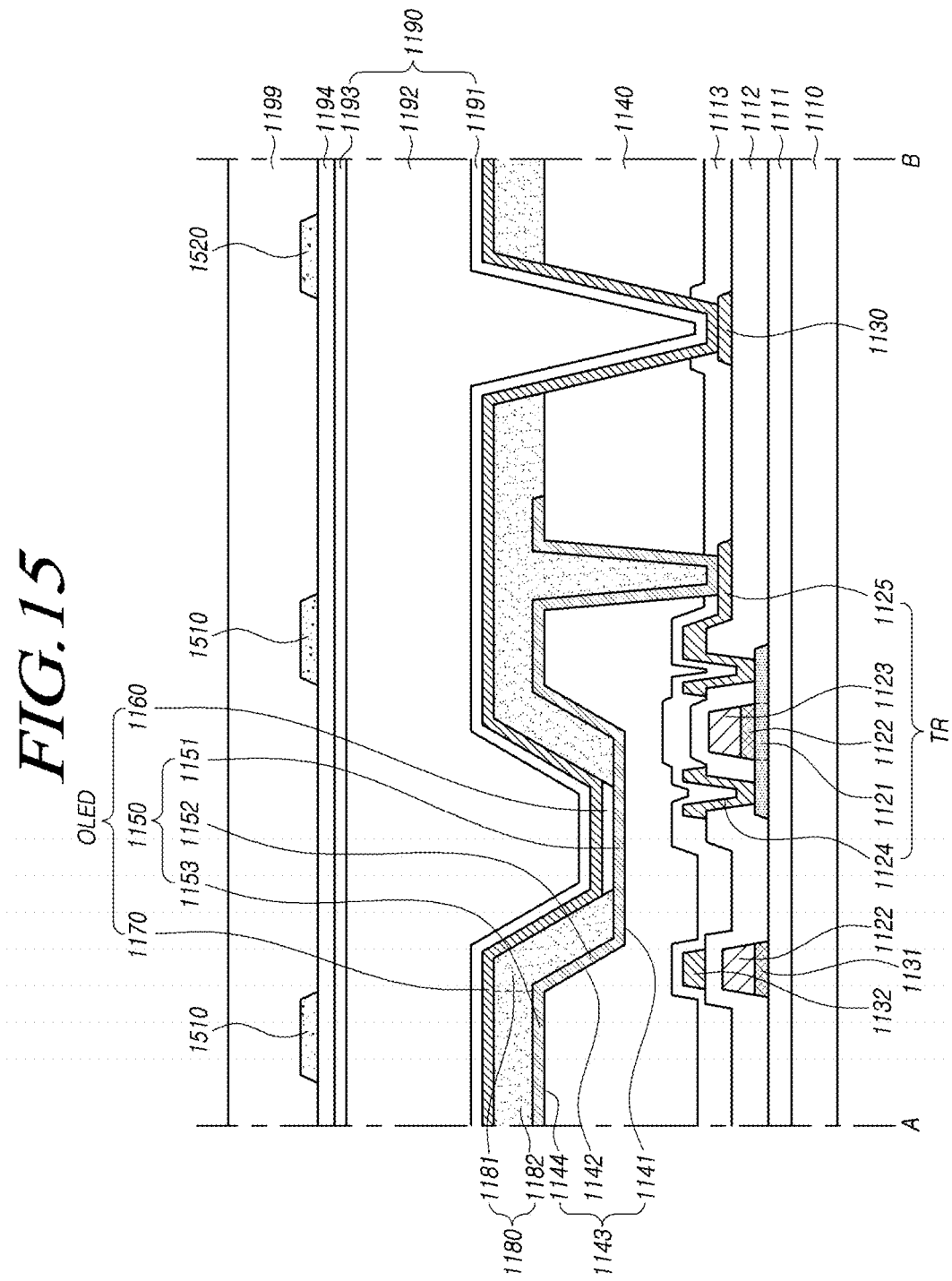
FIG. 15 is a cross-sectional view illustrating a display device according to another embodiment of the disclosure.

FIG. 15 is a cross-sectional view illustrating a display device according to another embodiment of the disclosure.

Substantially the same configurations and effects as those described above are not repeatedly described below.

Referring to FIG. 15, a light reflecting member 1510 and a touch electrode 1520 may be disposed on the first touch buffer layer 1194.

In other words, no bridge pattern may be present under the touch electrode 1520 and the light reflecting member 1510.

The light reflecting member 1510 and the touch electrode 1520 may be disposed on the same layer and be formed of the same material. For example, the light reflecting member 1510 and the touch electrode 1520 may include a light reflective metal, but embodiments of the disclosure are not limited thereto.

In this case, since the light reflecting member 1510 and the touch electrode 1520 may be formed in the same process, the process for the display device of the disclosure may be simplified.

As an example, the light reflecting member 1510 and the touch electrode 1520 may include different materials. For example, the light reflecting member 1510 may include a light reflective metal, and the touch electrode 1520 may include a transparent conductive material.

According to the disclosure, the structure of the insulation film to bring the second electrode of the organic light emitting diode (OLED) in contact with the auxiliary electrode may be varied depending on the layout structure of the organic layer.

This is described below with reference to FIG. 16.

Figure 16:
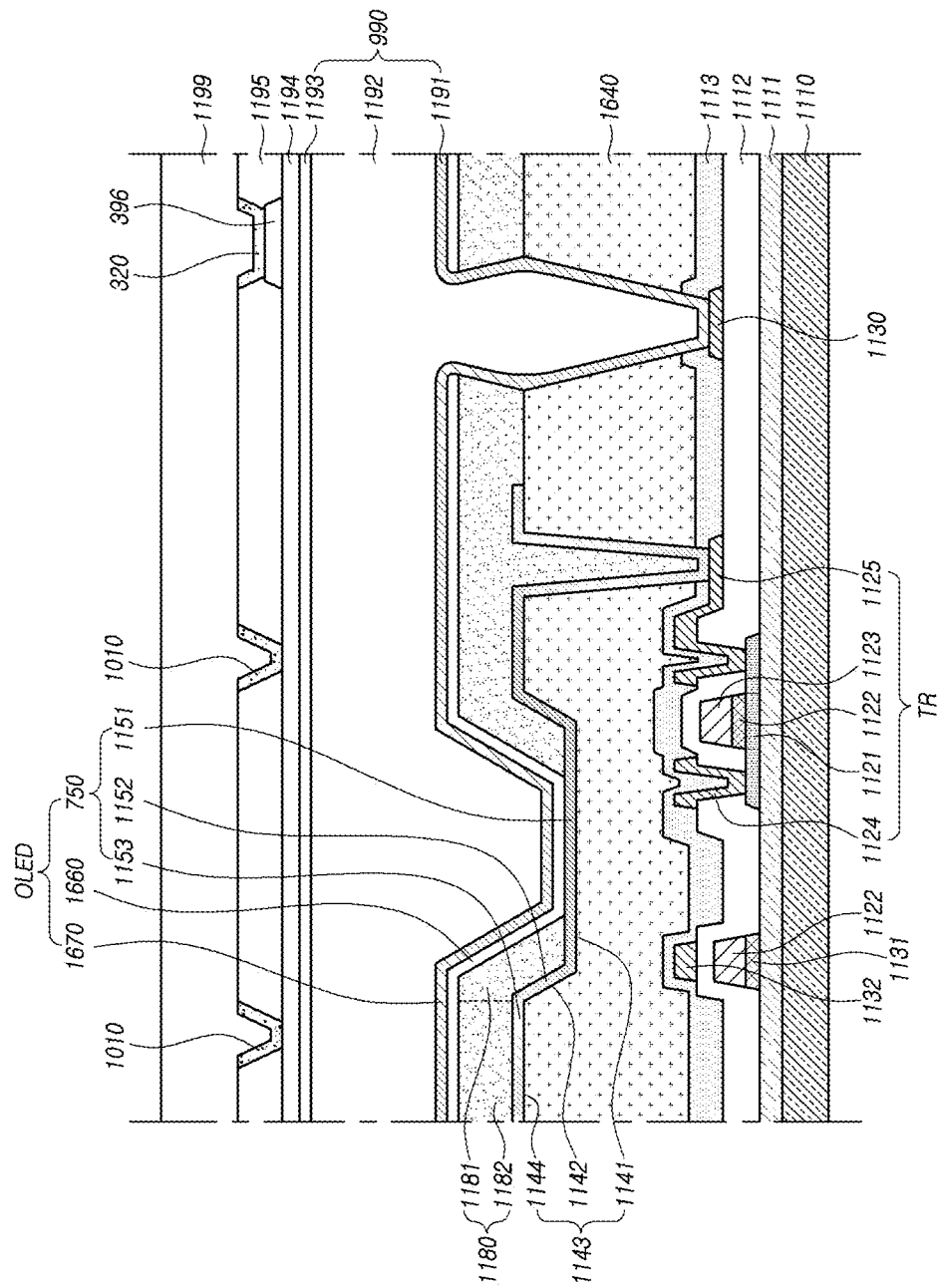
FIG. 16 is a cross-sectional view illustrating a display device according to another embodiment of the disclosure.

FIG. 16 is a cross-sectional view illustrating a display device according to another embodiment of the disclosure.

Substantially the same configurations and effects as those described above are not repeatedly described below.

Referring to FIG. 16, an organic layer 1660 of the organic light emitting diode (OLED) may be disposed to overlap the bank 1180 and a first electrode 750 in the active area A/A while exposing the top surface of an auxiliary electrode 1130.

In this structure, to allow the second electrode 1670 and the auxiliary electrode 1130 to contact each other, the bank 1180 may have such a structure that prevents the material of the organic layer 1660 from being deposited on the auxiliary electrode 1130 in the process of forming the organic layer 1660.

Specifically, as shown in FIG. 16, the bank 1180 may be shaped to widen as it goes away from the substrate 1110 in the area surrounding the hole exposing the auxiliary electrode 1130. In other words, as the bank 1180 goes farther away from the substrate 1110, the hole of the bank 1180 exposing the auxiliary electrode 1130 may become narrower.

As the process for forming the organic layer 1660, deposition or coating in which the source material features straightness may be adopted. For example, evaporation may be used. As the process of forming a second electrode 1670, deposition or coating in which the source material has irregular directivity may be used. For example, sputtering may be put to use.

Since the hole of the bank 1180 exposing the auxiliary electrode 1130 is narrow, the organic layer 1660 may not be disposed on the auxiliary electrode 1130 due to the processing properties of the organic layer 1660. Since the source material of the second electrode 1670 may enter the hole due to the processing properties of the second electrode 1670 although the hole of the bank 1180 is narrow, the second electrode 1670 may be formed also on the auxiliary electrode 1130.

According to embodiments of the disclosure, there may be provided a touch display device with light extraction efficiency enhanced through at least one concave portion formed in an insulation film and a light reflecting member provided in a non-display area.

According to embodiments of the disclosure, there may be provided a touch display device with a structure capable of preventing color mixing between adjacent pixels by applying a light reflecting member.

According to embodiments of the disclosure, there may be provided a touch display device with a structure simple to process by allowing the light reflecting member and the touch electrode to be formed in the same process.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

LEGEND OF REFERENCE NUMBERS

320: touch electrode
750: first electrode
760: organic layer
770: second electrode
990: encapsulation layer
1010: light reflecting member

What is claimed is:

1. A display device, comprising:
a substrate including an active area and a non-active area;
a transistor disposed on the substrate;
a sub-pixel electrically connected to the transistor, the sub-pixel comprising an organic light emitting diode;
an encapsulation layer disposed on the organic light emitting diode; and
a plurality of touch electrodes disposed on the encapsulation layer, the plurality of touch electrodes including an open area,
wherein the sub-pixel includes at least two emission areas and at least one non-emission area in the open area of the plurality of touch electrodes, the at least one non-emission area being configured to be in a black state or to have a lower brightness than the at least two emission areas, and
wherein each of the at least two emission areas and the at least one non-emission area has a shape of an octagon, a circle, an ellipse, a polygon, a triangle, a square, or a hexagon.

2. The display device according to claim 1, wherein the at least two emission areas include a first emission area and a second emission area, and
wherein the at least one non-emission area includes a first non-emission area disposed between the first emission area and the second emission area.

3. The display device according to claim 2, wherein the first non-emission area surrounds the first emission area, and the second emission area surrounds the first non-emission area.

4. The display device according to claim 2, wherein the at least one non-emission area of the sub-pixel further includes a second non-emission area, the second non-emission area surrounding the first and second emission areas in the open area of the plurality of touch electrodes.

5. The display device according to claim 4, further comprising:
a light reflecting member in the second non-emission area and surrounding the second emission area.

6. The display device according to claim 5, wherein the plurality of touch electrodes and the light reflecting member are disposed on a same layer and include a same material.

7. The display device according to claim 1, wherein the plurality of touch electrodes form a mesh or lattice shape comprising the open area.

8. The display device according to claim 7, further comprising:
at least one other sub-pixel including at least two emission areas,
wherein the open area of the plurality of touch electrodes includes the at least two emission areas of one or more of the sub-pixel and the at least one other sub-pixel.

9. The display device according to claim 1, wherein the open area of the plurality of touch electrodes has a shape of a diamond, a rectangle or a square.

10. The display device according to claim 1, wherein touch electrodes disposed along a same row or column among the plurality of touch electrodes are connected to each other via a bridge pattern to form one driving touch electrode line or one sensing touch electrode line.

11. The display device according to claim 10, further comprising a touch line electrically connected with the touch electrodes disposed along the same row or column,
wherein the touch line is disposed on a same layer as the touch electrodes disposed along the same row or column.

12. The display device according to claim 11, further comprising an auxiliary line electrically connected with the touch line,
wherein the auxiliary line is disposed on a same layer as the bridge pattern.

13. The display device according to claim 12, further comprising a buffer layer between the touch line and the auxiliary line,
wherein the touch line contacts the auxiliary line via a contact hole in the buffer layer.

14. The display device according to claim 11, further comprising an insulation film on the transistor,
wherein the touch line is disposed along a side surface of the insulation film.

15. The display device according to claim 11, further comprising a dam and a pad portion at a periphery of the dam in the non-active area,
wherein the touch line is disposed on the dam and extends toward the pad portion.

16. The display device according to claim 15, wherein the touch line is electrically connected with a pad in the pad portion through a pad connection line.

17. The display device according to claim 15, wherein the touch line is directly connected to a pad in the pad portion.

18. The display device according to claim 15, further comprising a buffer layer on the encapsulation layer,
wherein the touch line, the encapsulation layer, and the buffer layer overlap with the dam in a plan view.

19. The display device according to claim 15, further comprising at least one other dam, wherein the dam and the at least one other dam have different heights.

20. The display device according to claim 1, further comprising a plurality of buffer layers on the encapsulation layer.

21. The display device according to claim 20, further comprising a planarization film on the plurality of buffer layers.

22. The display device according to claim 1, further comprising a color filer layer between the plurality of touch electrodes and the encapsulation layer, or on the plurality of touch electrodes.

23. The display device according to claim 1, further comprising an insulation film between the transistor and the organic light emitting diode, the insulation film including a concave portion and a flat portion.

24. The display device according to claim 23, wherein the at least one non-emission area overlaps the flat portion of the insulation film.

* * * * *